(12) United States Patent
Sawayama et al.

(10) Patent No.: US 6,184,960 B1
(45) Date of Patent: Feb. 6, 2001

(54) METHOD OF MAKING A REFLECTIVE TYPE LCD INCLUDING PROVIDING A PROTECTIVE METAL FILM OVER A CONNECTING ELECTRODE DURING AT LEAST ONE PORTION OF THE MANUFACTURING PROCESS

(75) Inventors: Yutaka Sawayama, Tenri; Koji Taniguchi, Nara; Shinya Yamakawa, Ikoma; Atsushi Ban, Nara; Yoshihiro Okada, Yamatotakada; Atsuhito Murai, Soraku-gun; Takayuki Shimada, Yamatokoriyama, all of (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/223,269

(22) Filed: Dec. 30, 1998

(30) Foreign Application Priority Data

Jan. 30, 1998 (JP) .................................................. 10-020012
Feb. 27, 1998 (JP) .................................................. 10-047221
Dec. 15, 1998 (JP) .................................................. 10-356809

(51) Int. Cl.[7] ........................ G02F 1/1343; G02F 1/136; G02F 1/13; H01L 29/04
(52) U.S. Cl. ............................. 349/139; 349/38; 349/42; 349/187; 257/59; 257/73
(58) Field of Search ................................. 349/113, 187, 349/38, 42, 139, 143; 257/59, 73

(56) References Cited

U.S. PATENT DOCUMENTS 5,159,477 * 10/1992 Shimada et al. ........................ 359/59
5,182,620 * 1/1993 Shimada et al. ........................ 257/72
5,543,946   8/1996 Enomoto et al. ....................... 359/87
5,594,259 * 1/1997 Shimada et al. ........................ 257/66
5,877,830 * 3/1999 Shimada et al. ...................... 349/113
5,910,829 * 6/1999 Shimada et al. ...................... 349/110
5,953,583 * 9/1999 Ban et al. .............................. 438/30
6,043,859 * 3/2000 Maeda .................................. 349/143

FOREIGN PATENT DOCUMENTS 3-246524   11/1991 (JP) .
09 160311   3/1999 (JP) .

OTHER PUBLICATIONS

"Anti–Corrosion Process for Al–ITO System with Electrolytic Development Solution" Nishino et al., pp. 31–36, along with an English Translation thereof (pp. 1–9).

* cited by examiner

Primary Examiner—William L. Sikes
Assistant Examiner—Tarifur R. Chowdhury
(74) Attorney, Agent, or Firm—Nixon & Vanderhye P.C.

(57) ABSTRACT

A method for producing a substrate of a reflection type liquid crystal display device is provided. The method includes the steps of: forming the input portion for inputting a signal from outside and the connecting electrode on the substrate on which the reflective electrode is formed; forming a protective film on the connecting electrode; forming an interlayer insulator under the condition that the protective film on the connecting electrode is exposed; patterning the interlayer insulator; forming a reflective electrode film on the interlayer insulator; patterning the reflective electrode film to form the reflective electrode; and removing the protective film on the connecting electrode to expose the connecting electrode.

26 Claims, 30 Drawing Sheets

FIG. 4A
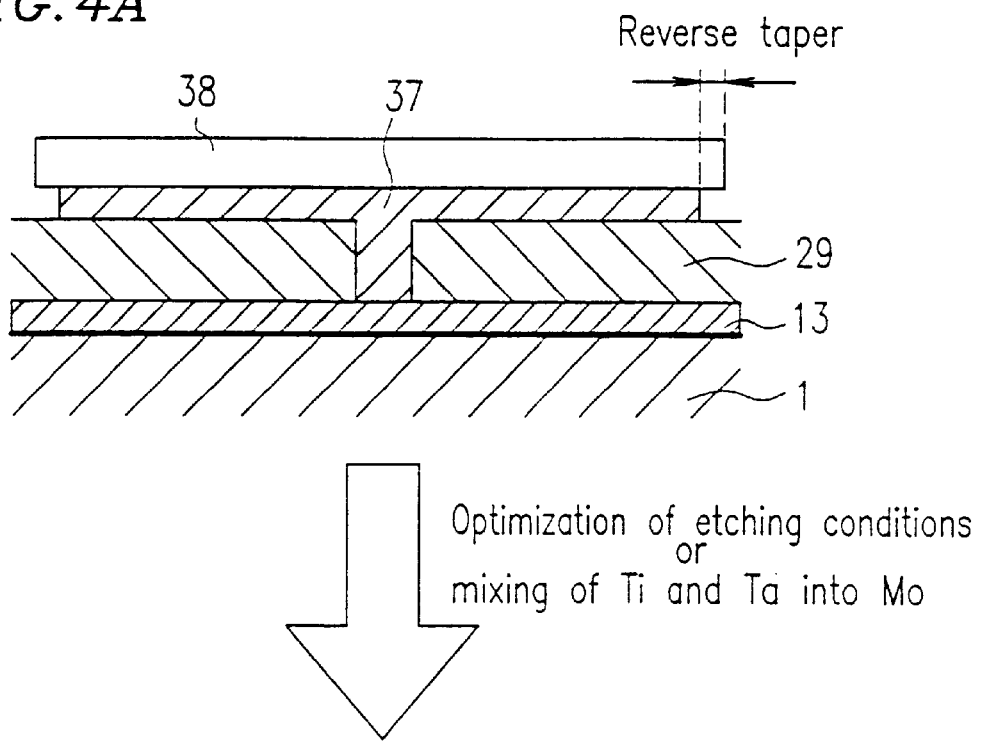
Optimization of etching conditions
or
mixing of Ti and Ta into Mo
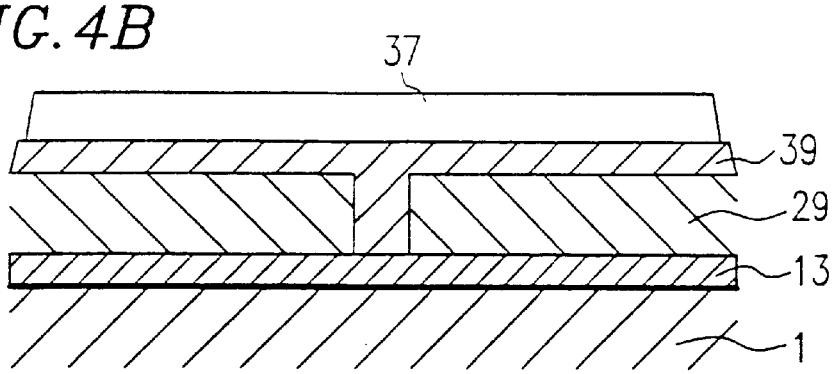
FIG. 4B

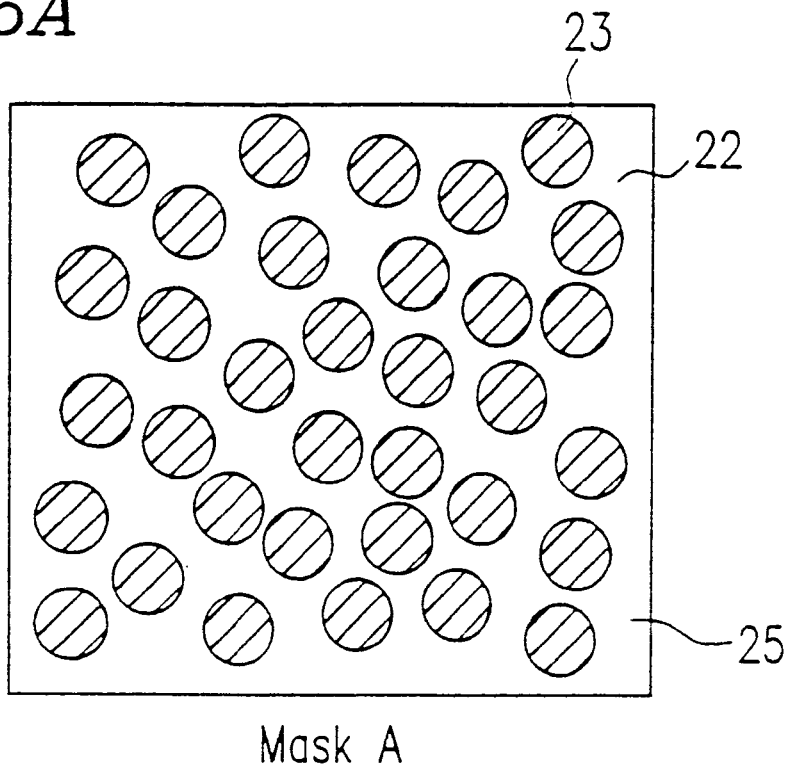
Mask A
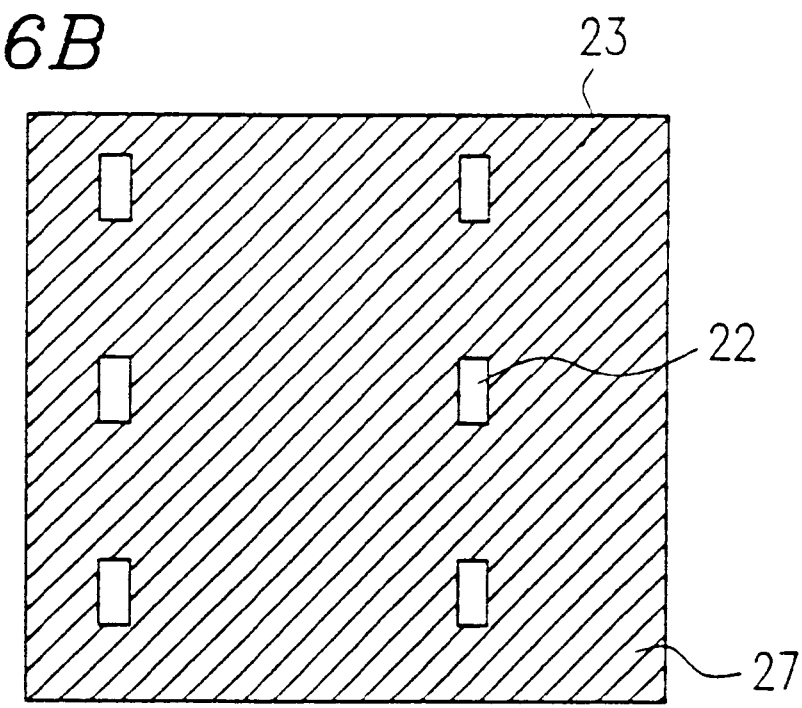
Mask B

Glass substrate

Photosensitive resin 24 is coated

Light exposure : photomask A(25)
26 : UV light

Development

Baking : shape of resin is changed

Photosensitive resin 28 for smoothing is coated

Light exposure through a contact hole : photomask B(27)

Development and baking

Reflective electrode 4 is formed

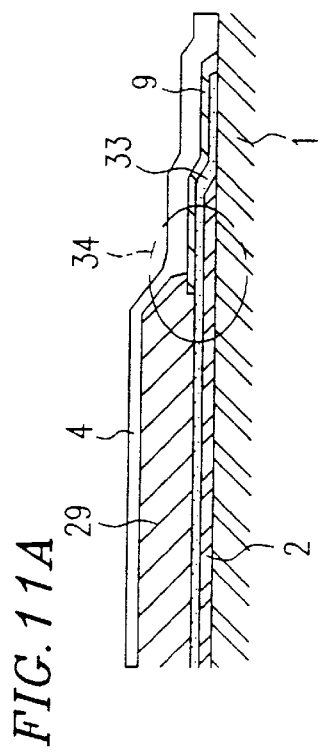# FIG.11C1
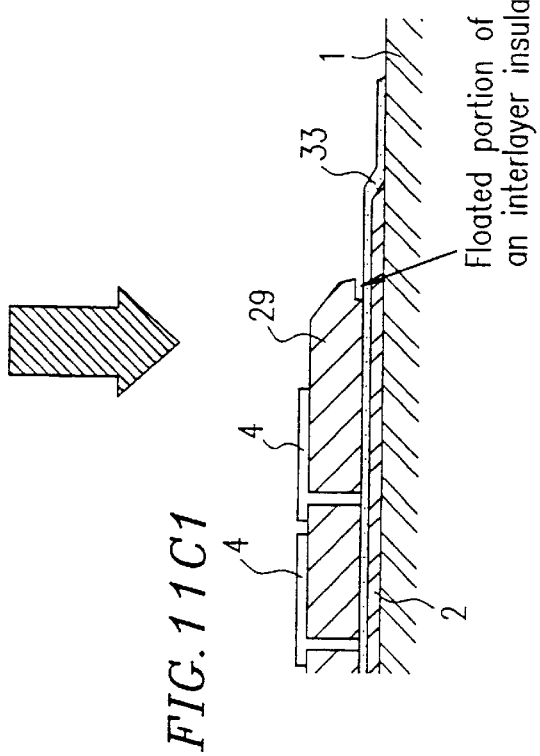# FIG.11C2

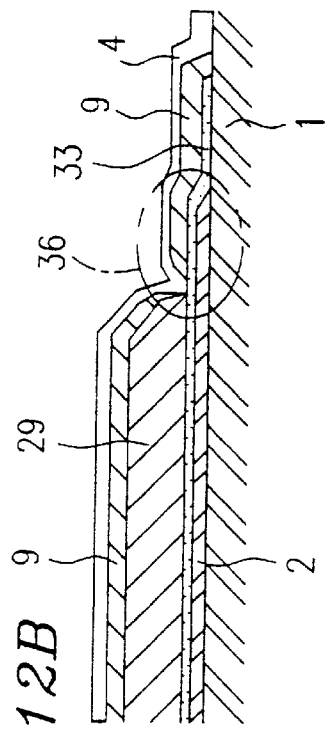
FIG.12A
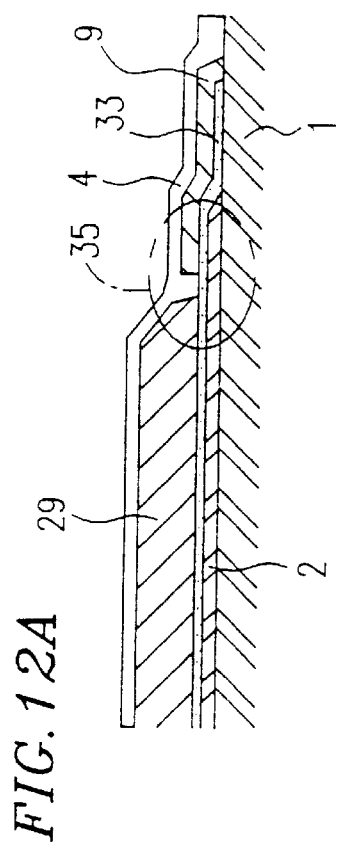
FIG.12B
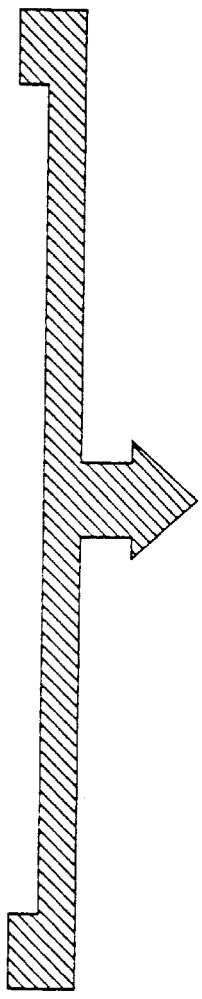
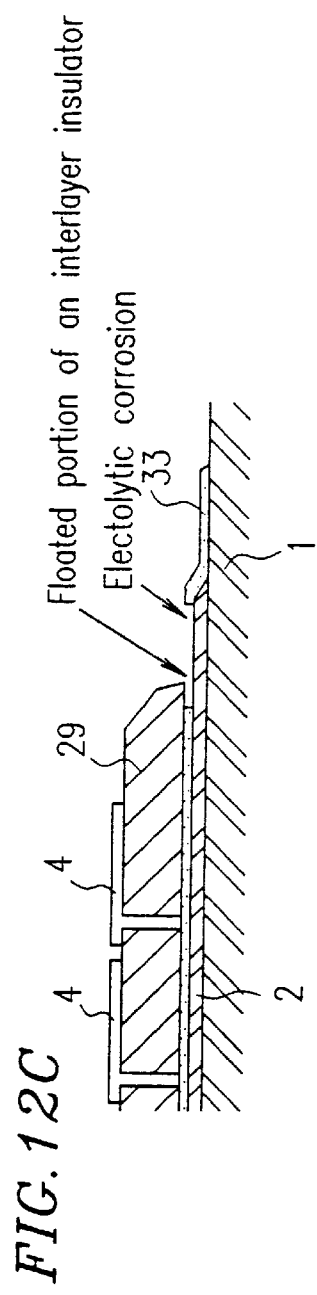
FIG.12C

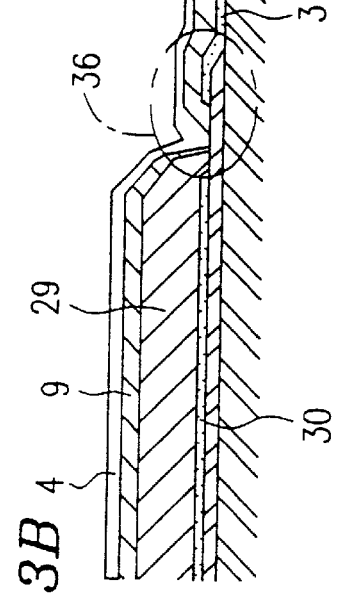
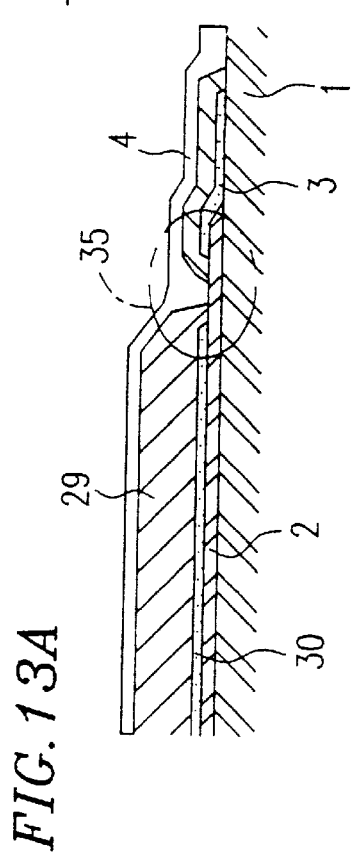
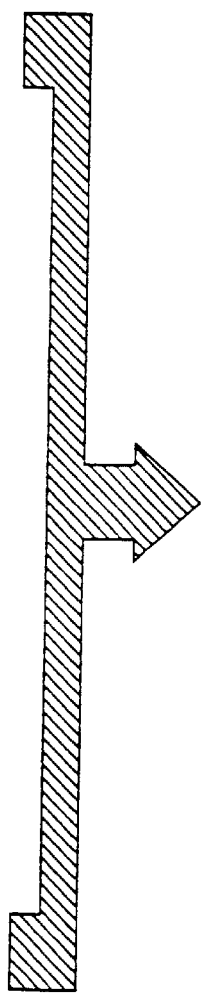
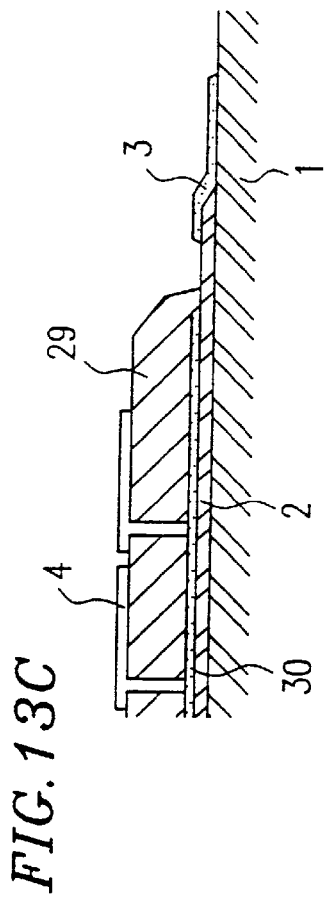
FIG. 13A  FIG. 13B  FIG. 13C

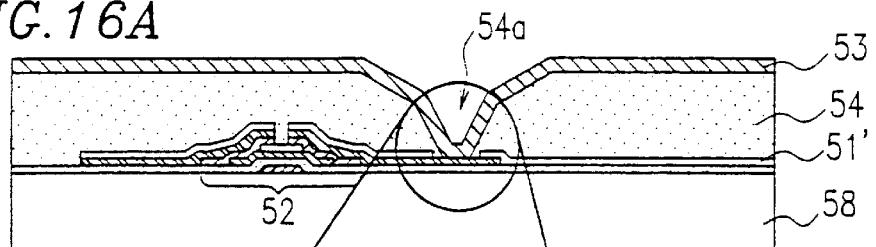
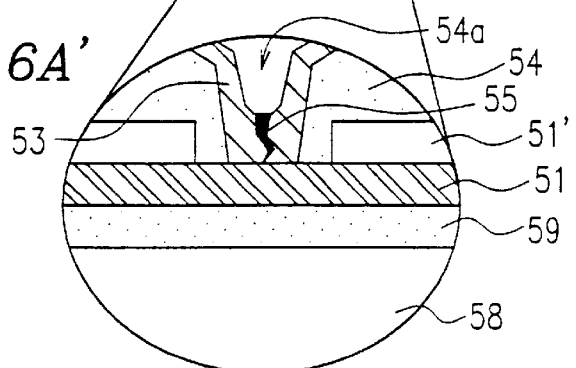
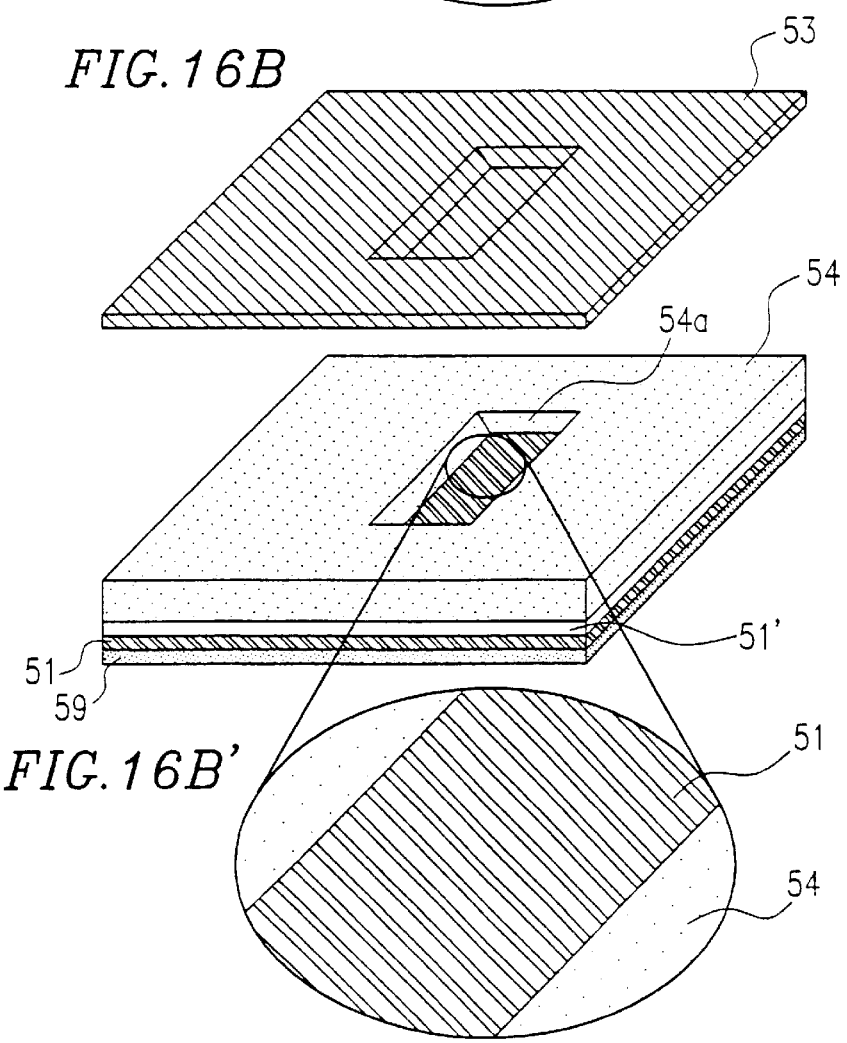

FIG.18A
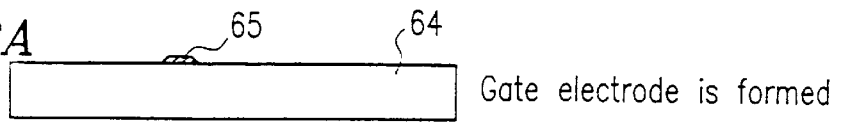
Gate electrode is formed

FIG.18B
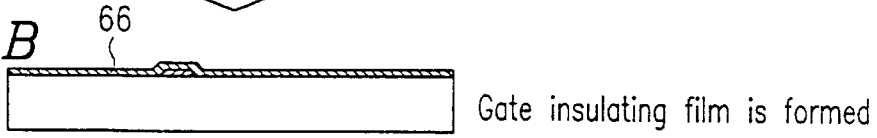
Gate insulating film is formed

FIG.18C
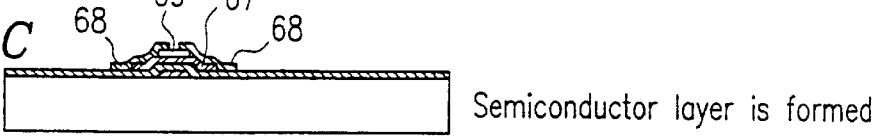
Semiconductor layer is formed

FIG.18D
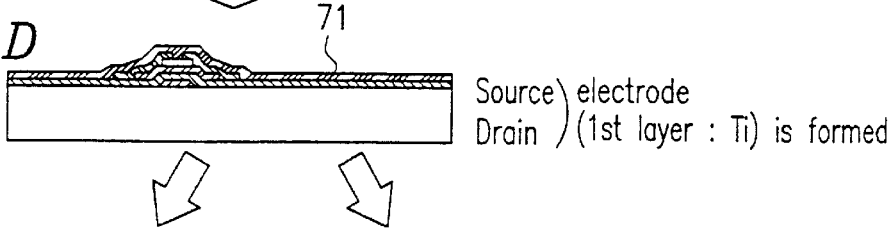
Source/Drain electrode (1st layer : Ti) is formed

FIG.18E
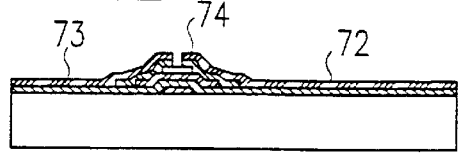
Source/Drain/Pixel electrode is formed

FIG.18H
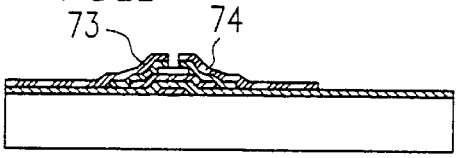
Source/Drain electrode is formed

FIG.18F
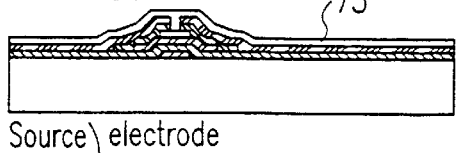
Source/Drain electrode (2nd layer : ITO) is formed

FIG.18I
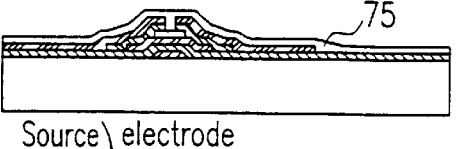
Source/Drain electrode (2nd layer : ITO) is formed

FIG.18G
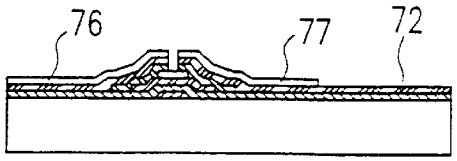
Source/Drain electrode is formed

FIG.18J
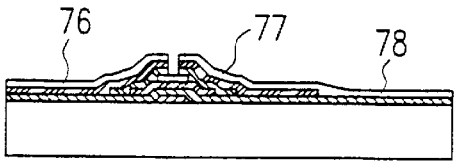
Source/Drain/Pixel electrode is formed

Gate electrode is formed

Gate insulating film is formed

Semiconductor layer is formed

Source/Drain electrode (Ti) is formed

Source/Drain electrode (ITO) is formed

Source/Drain/Pixel electrode is formed

Source/Drain/Pixel electrode is formed

PRIOR ART

PRIOR ART

PRIOR ART

METHOD OF MAKING A REFLECTIVE TYPE LCD INCLUDING PROVIDING A PROTECTIVE METAL FILM OVER A CONNECTING ELECTRODE DURING AT LEAST ONE PORTION OF THE MANUFACTURING PROCESS

BACKGROUND OF THE INVENTION

1. Field of the Invention

The present invention relates to a substrate in a reflective liquid crystal display device used as a display of a personal computer and the like and a method for producing the same.

2. Description of the Related Art

In recent years, portable OA (Office Automation) equipment such as personal computers have been developed, and a reduction in a cost of a display device has become an important subject. Such a display device has a structure in which a pair of substrates each having electrodes are provided so as to interpose a display medium having electrooptical characteristics therebetween, and a voltage is applied across the electrodes, whereby a display is performed. Liquid crystal, an electroluminescence material, a plasma material, an electrochromic material, etc. are used for such a display medium. In particular, liquid crystal displays (LCDs) have been most developed for commercial use since they allow a display to be performed with low power consumption.

Considering a display mode and a driving method of a liquid crystal display device, a simple matrix system using a super twisted nematic cell is suitable for the largest cost reduction. However, a high resolution, a high contrast, a multi-scale (multi-color, full-color), and a large viewing angle have been required with the advancement of multimedia information, and a simple matrix system is not sufficient for these purposes.

In view of the above, an active matrix system is proposed, in which a switching element (active element) is provided at each pixel, whereby the number of scanning lines (also, called scanning electrodes) which can be driven is increased. Due to the active matrix system, a high resolution of a display, a high contrast, a multi-scale, and a large viewing angle are being achieved. In an active matrix type liquid crystal display device, pixel electrodes provided in a matrix and scanning lines extending in the vicinity of the pixel electrodes are electrically connected through active elements.

The active elements include two-terminal non-linear elements (Metal-Insulator-Metal; MIM) and three-terminal non-linear elements. Currently used representative active elements are three-terminal thin film transistors (TFTs).

In recent years, there is an increased demand for a further reduction in power consumption. Under this circumstance, reflection type liquid crystal display devices have been extensively developed instead of transmission type liquid crystal display devices which usually require backlights.

A liquid crystal display device having both the reflection type function and the transmission type function is proposed (Japanese Patent Application No. 9-201176). The proposed liquid crystal display device has the following structure: in the case of a dark atmosphere, a display is performed by utilizing light transmitted through a transmission portion from a blacklight; in the case where external light is dark, a display is performed by utilizing light transmitted through a transmission portion from a blacklight and light reflected from a reflection portion; and in the case where external light is bright, a display is performed by utilizing light reflected from a reflection portion.

In order to obtain a bright display in a reflection type liquid crystal display device, it is required to increase the intensity of light scattering in a direction vertical to a display screen, with respect to light incident at any angle. For this purpose, a reflective plate having optimum reflection characteristics needs to be produced. More specifically, a surface of a substrate made of glass or the like is provided with controlled unevenness so as to have optimum reflection characteristics, and a reflective plate having a thin film made of silver or the like thereon needs to be formed on the surface.

According to a practically used method, for example, photosensitive resin is coated onto a substrate, and the photosensitive resin is exposed to light through a light-blocking member having circular light-blocking regions and developed, followed by heat treatment, whereby a plurality of convex portions are formed. Then, an insulating protective film is formed along the shape of the convex portions, and a reflective plate made of a metal thin film is formed on the insulating protective film.

Furthermore, the problem of double reflection due to the influence of the thickness of glass which is caused by forming a reflective plate outside a substrate (on the opposite side of a liquid crystal layer) is overcome by forming a reflective plate inside a substrate so as to overlap the reflective plate on the electrodes (i.e., reflective electrodes).

Needless to say, it is preferable to use a material having a high reflectivity for a reflective electrode in a conventional reflection type liquid crystal display device. In this respect, Ag is optimum. However, Ag is a material having a high diffusion rate to an Si layer, so that problems of diffusion to, and reaction with, an underlying layer are serious.

In contrast, Al is not likely to diffuse to, and react with, an underlying layer, and is widely used for metallization in an integrated circuit. Furthermore, Al has satisfactory characteristics such as etching conditions, so that Al is mostly used for a reflective electrode. Such an Al reflective electrode film is etched by a wet etching method in an etchant containing nitric acid, acetic acid, phosphoric acid, and water.

In the above-mentioned prior art, ITO (indium tin oxide) used for a transparent electrode portion is used for lines for transmitting a video signal and electrodes for connecting a driver for driving liquid crystal so as to prevent them from having a high resistance due to oxidation of the connecting portion during the later step.

In the above-mentioned case of forming a reflective electrode on a substrate, particularly during a mass-production step, it is impossible to partially form an Al film without using a special film forming technique such as mask deposition, so that the Al film is formed over the entire surface of a liquid crystal panel including an ITO portion such as a terminal portion. When the reflective electrode film is subjected to wet etching, the following problem arises.

FIGS. 30A through 30F are cross-sectional views showing a process for forming a connecting electrode in a terminal portion of a scanning line of a conventional liquid crystal display device. FIGS. 31A through 31F are cross-sectional views showing a process for forming a connecting electrode in a terminal portion of a signal line of a conventional liquid crystal display device.

As shown in FIGS. 30A and 31A, in a terminal portion of a scanning line and a signal line, a Ta line which is to be a scanning line 1052 is formed on a substrate, and then, a gate insulating film 1055 is formed.

As shown in FIGS. 30B and 31B, an ITO film 1058 which is to be a signal line and a signal line film 1059 are formed. Thereafter, the metal layers formed during the previous step is patterned, whereby a connecting electrode 1065 is formed as shown in FIG. 30C and a connecting electrode 1066 is formed, leaving only a part of the ITO film 1058, as shown in FIG. 31C.

Then, as shown in FIGS. 30D and 31D, an interlayer insulator 1061 is formed. Thereafter, a reflective electrode 1063 made of Al is formed. During a mass-production step, it is impossible to partially form an Al film, so that the Al film is formed over the entire surface of the substrate. Therefore, as shown in FIGS. 30E and 31E, the reflective electrode 1063 is formed even on the connecting electrodes 1065 and 1066. Under this condition, a resist film 1064 is exposed to light and developed by photolithography.

In general, a thin film contains an order-of-magnitude more lattice defects than a bulk material, and the thin film will have an incomplete crystal structure. Therefore, a number of pinholes and active regions are formed in a reflective electrode film. In the case where such a film is developed, the reflective electrode 1063 is damaged by the use of an alkali-type developer, as shown in FIGS. 30F and 31F, promoting the growth of pinholes and the corrosion of active regions.

As described above, according to the conventional method for forming a connecting electrode, a developer comes into contact with the connecting electrodes 1065 and 1066 made of ITO, as well as the reflective electrode 1063, forming a battery system. Due to the reaction of such a battery system, the connecting electrodes 1065 and 1066 and the reflective electrode 1063 are corroded and dissolved, and this electrolytic corrosion substantially decreases the production yield of an active matrix substrate.

As shown in FIG. 32A, an ITO electrode 1041 and an Al electrode 1040 are formed on a glass substrate 1001. In the case where the Al electrode 1040 is patterned to a predetermined shape under this condition, a photolithography step is utilized as shown in FIG. 32B. However, when light exposure and development are performed for forming a resist film 1005, the Al electrode 1040 is damaged by the use of an alkali-type developer. As a result, the corrosion and growth of active regions and pinholes (hereinafter, referred to as pinholes 1007) shown in FIGS. 32A and 32B are promoted (see FIG. 32C). This brings a developer 1006 into contact with the ITO electrode 1041 and the Al electrode 1040 simultaneously, whereby a battery system schematically shown in FIG. 32D is formed. Due to the reaction of the battery system, the Al electrode 1040 and the ITO electrode 1041 are corroded and dissolved, so that production yield of a TFT and production yield of a reflection type liquid crystal display device are decreased without fail. This development step is described in detail in Sharp Report: No. 44, March, 1990 and the like. Therefore, the description thereof is omitted here.

SUMMARY OF THE INVENTION

A method for producing a substrate of a reflection type liquid crystal display device of the present invention is provided. The device includes a transparent substrate, a substrate having a reflective electrode, a liquid crystal layer interposed between the substrates, the reflective electrode being formed adjacent to the liquid crystal layer, and a connecting electrode connecting an input portion for inputting a signal from outside to the liquid crystal display device, the reflective electrode being connected to the connecting electrode through a bus line. The method includes the steps of: forming the input portion for inputting a signal from outside and the connecting electrode on the substrate on which the reflective electrode is formed; forming a protective film on the connecting electrode; forming an interlayer insulator under the condition that the protective film on the connecting electrode is exposed; patterning the interlayer insulator; forming a reflective electrode film on the interlayer insulator; patterning the reflective electrode film to form the reflective electrode; and removing the protective film on the connecting electrode to expose the connecting electrode.

In one embodiment of the present invention, the protective film is a protective metal film composed of a metal film, and the reflective electrode film, the protective metal film, and a metal film produced during a previous step are made of a material having etching selectivity.

In another embodiment of the present invention, a switching element is provided between the reflective electrode and the bus line.

In another embodiment of the present invention, a thin film transistor is formed as the switching element.

In another embodiment of the present invention, the interlayer insulator is formed so as to cover a region which is at least larger than a display area.

In another embodiment of the present invention, the interlayer insulator is formed so as to be also present in a region outside a pixel in a display area.

In another embodiment of the present invention, a photosensitive resin film is used as the interlayer insulator.

In another embodiment of the present invention, a plurality of uneven shapes are formed by patterning a portion of the photosensitive resin film under the reflective electrode.

In another embodiment of the present invention, a material for the connecting electrode is ITO.

In another embodiment of the present invention, a material for the connecting electrode is ITO, and a material for the reflective electrode is Al.

In another embodiment of the present invention, the protective film is a protective metal film composed of a metal film, and a material for the reflective electrode and metal for forming the protective film are prescribed so as to be etched with an identical etchant.

In another embodiment of the present invention, a material for the connecting electrode is ITO, and the protective film formed on the connecting electrode is made of Mo or an alloy containing Mo as its main component.

In another embodiment of the present invention, a material for the connecting electrode is ITO, and the protective film formed on the connecting electrode is made of Ti or an alloy containing Ti as its main component.

Alternatively, a method for producing a substrate in a reflection type liquid crystal display device of the present invention is provided. The device includes a transparent substrate, a substrate having a reflective electrode, a liquid crystal layer interposed between the substrates, the reflective electrode being formed adjacent to the liquid crystal layer, and a connecting electrode connecting an input portion for inputting a signal from outside to the liquid crystal display device, the reflective electrode being connected to the connecting electrode through a bus line. The method includes the steps of: forming an interlayer insulator on the substrate on which the reflective electrode is formed under the condition that the input portion for inputting a signal from outside and the connecting electrode are exposed; patterning the interlayer insulator; forming a protective film on the interlayer insulator; forming a reflective electrode film; patterning the reflective electrode film to form a reflective electrode; removing the protective film on the connecting electrode to expose the connecting electrode.

In one embodiment of the present invention, the protective film is a protective metal film composed of a metal film, and the reflective electrode film, the protective metal film, and a metal film produced during a previous step are made of a material having etching selectivity.

In another embodiment of the present invention, a switching element is provided between the reflective electrode and the bus line.

In another embodiment of the present invention, a thin film transistor is formed as the switching element.

In another embodiment of the present invention, the interlayer insulator is formed so as to cover a region which is at least larger than a display area.

In another embodiment of the present invention, the interlayer insulator is formed so as to be also present in a region outside a pixel in a display area.

In another embodiment of the present invention, a photosensitive resin film is used as the interlayer insulator.

In another embodiment of the present invention, a plurality of uneven shapes are formed by patterning in a portion of the photosensitive resin film under the reflective electrode.

In another embodiment of the present invention, a material for the connecting electrode is ITO.

In another embodiment of the present invention, a material for the connecting electrode is ITO, and a material for the reflective electrode is Al.

In another embodiment of the present invention, the protective film is a protective metal film composed of a metal film, and a material for the reflective electrode and metal for forming the protective film are prescribed so as to be etched with an identical etchant.

In another embodiment of the present invention, a material for the connecting electrode is ITO, and the protective film formed on the connecting electrode is made of Mo or an alloy containing Mo as its main component.

In another embodiment of the present invention, a material for the connecting electrode is ITO, and the protective film formed on the connecting electrode is made of Ti or an alloy containing Ti as its main component.

According to another aspect of the present invention, a substrate of a reflection type liquid crystal display device is provided. The device includes a transparent substrate, a substrate having a reflective electrode, and a liquid crystal layer interposed between the substrates, wherein a protective metal film is formed on at least a part of the reflective electrode, and the reflective electrode comes into contact with a conductive portion through the protective metal film.

Alternatively, a substrate of a reflection type liquid crystal display device of the present invention is provided. The device includes a transparent substrate, a substrate having a switching element, an interlayer insulator, and a reflective electrode, and a liquid crystal layer interposed between the substrates, wherein a protective metal film is formed between the interlayer insulator and the reflective electrode, the reflective electrode and the protective metal film being connected to an output electrode of the switching element through a contact hole, and the output electrode of the switching element is made of at least one of materials for a signal line of the switching element.

In one embodiment of the present invention, the output electrode of the switching element is made of ITO.

According to another aspect of the present invention, a method for producing a liquid crystal display device is provided. The device includes, on one of a pair of substrates disposed so as to be opposed to each other with a liquid crystal layer interposed therebetween, a plurality of scanning lines, a plurality of signal lines disposed so as to cross the scanning lines, switching elements disposed in the vicinity of crossing portions of the scanning lines and the signal lines, pixel electrodes connected to the switching elements, at least a part of the pixel electrodes or the entire pixel electrodes having a reflective function, and connecting electrodes for inputting a signal from outside. The method includes the steps of: forming the plurality of scanning lines and the switching elements on one of the substrates; forming at least two different kinds of metal layers on the substrate including the scanning lines and the switching elements; patterning the metal layers to form the signal lines and a connecting electrode portion for inputting a signal from outside; forming an interlayer insulator on the substrate by patterning; forming a film with a material having a reflective function on the substrate including the interlayer insulator; patterning the material having a reflective function to form a part of the pixel electrodes or the entire pixel electrodes; and partially removing the metal layers, leaving at least one of the at least two kinds of metal layers forming the connecting electrode portion, thereby forming the connecting electrodes for inputting a signal from outside.

In one embodiment of the present invention, the step of patterning the material having a reflective function and the step of partially removing the metal layers, leaving at least one of the at least two kinds of metal layers forming the connecting electrode portion are simultaneously conducted by etching using an identical etchant.

In another embodiment of the present invention, the signal lines and the at least two different kinds of metal layers forming the connecting electrode portion for inputting signal from outside are composed of an ITO film, and one of Mo, an alloy containing Mo as its main component, Ta and an alloy containing Ta as its main component or a layered film thereof.

Hereinafter, the function of the present invention will be described.

According to the present invention, as shown in FIG. 2A, an ITO electrode to be a connecting electrode 3 is formed. Then, a protective film 9 is formed so as to cover the connecting electrode 3 made of ITO before forming an Al electrode to be a reflective electrode 4 as shown in FIGS. 2B and 2C, whereby the above-mentioned problem is overcome. The Al electrode to be the reflective electrode 4 and the protective film 9 formed on the connecting electrode 3 made of ITO are temporarily provided during formation of an Al film. In a final configuration shown in FIG. 2F, the connecting electrode 3 made of ITO will be exposed.

As a material for a metal film used for this purpose, Mo, a Mo alloy, and the like are known. The details thereof are described in Japanese Laid-open Publication No. 3-246524. Japanese Laid-open Publication No. 3-246524 describes a wiring structure in a pixel portion, but fails to describe problems caused in a connecting terminal portion in the course of producing a reflective electrode.

According to the present invention, a protective film is formed on a connecting electrode before forming a reflective electrode, thereby preventing the connecting electrode from coming into contact with the reflective electrode in the course of production.

According to the present invention, a protective metal film is formed after an interlayer insulator is formed; thereafter, a reflective electrode film is formed, whereby films can be continuously formed during the identical film formation step, and one step of forming a film can be omitted.

In one embodiment of the present invention, a protective film is formed of a metal film, and etching selectivity between materials used during each step is optimized, whereby etching processing can be conducted continuously. Therefore, photolithography is not newly required for the purpose of removing the protective film, and thus the number of steps can be reduced.

In another embodiment of the present invention, a switching element (e.g., MIM, TFT, etc.) is provided between a reflective electrode and a bus line, which substantially decreases the limit to the number of scanning lines, and the like. This has the effects that a degree of flexibility in designing a liquid crystal display mode is increased and high precision can be obtained.

In another embodiment of the present invention, a large ratio of a voltage applied to liquid crystal can be obtained by using a TFT utilizing Si such as amorphous silicon and polysilicon as a switching element. Therefore, the above-mentioned effects can be exhibited more efficiently.

In another embodiment of the present invention, an interlayer insulator film is formed in an area larger than a display area, whereby a non-contact region of an insulating material other than a protective metal film can be formed between a reflective electrode and a connecting electrode which will remain in a final configuration. This region defines a margin (positional shift of light exposure during photolithography, overetching during an etching step, etc.) when a reflective electrode and a protective film protecting a connecting electrode are formed into a predetermined shape, which contributes to the improvement of a percentage of good products which can be produced.

In another embodiment of the present invention, an interlayer insulator is formed so as to cover even a portion other than a pixel electrode (e.g., a bus line), whereby a reflective electrode can be formed even on the bus line. As a result, a high aperture ratio can be obtained, and display brightness is increased.

In another embodiment of the present invention, when a photosensitive resin material is used for an interlayer insulator, processing of the interlayer insulator can be completed by photolithography. In the case of an interlayer insulator made of an inorganic type material, due to the use of highly reactive strong acid such as hydrofluoric acid, the effect on underlying layers needs to be considered. In the case of an interlayer insulator made of an organic material having no photosensitivity, the steps of dry etching and ashing are required after photolithography. Thus, compared with these cases, the use of a photosensitive resin material for the interlayer insulator makes the process easier and decreases the number of steps.

In another embodiment of the present invention, a number of uneven shapes are formed on a photosensitive resin film under a reflective electrode, whereby the reflective electrode having a light dispersion property is formed adjacent to a liquid crystal layer. Thus, a decrease in resolution of a display image and occurrence of shades are prevented.

In another embodiment of the present invention, a connecting electrode is made of ITO, whereby high resistance due to oxidation of a terminal portion caused during various steps can be prevented.

In another embodiment of the present invention, ITO and Al which have a remarkably high electrode potential and are likely to form a local battery system can be prevented from causing electrolytic corrosion without conducting a special step such as mask deposition. Thus, Al which has an outstanding processing property and reflectivity can be easily utilized as a reflective electrode.

In another embodiment of the present invention, by using materials, which can be etched with the identical etchant, for a protective metal film and a reflective electrode, or by using a combination of etchants which can etch both the protective metal film and the reflective electrode, continuous film formation and continuous etching become possible, which enables a liquid crystal display device to be produced by the steps whose number is equal to those of a process in which a protective metal film is not formed.

In another embodiment of the present invention, a protective metal film is made of Mo and a reflective electrode is made of Al. Mo and Al are both etched with an etchant containing a combination of nitric acid, acetic acid, phosphoric acid, and water. Furthermore, this etchant is less reactive with each metal material forming a liquid crystal display device, and it is not substantially necessary to consider the effect of the etchant on the other components. Thus, this etchant is the most useful combination. Furthermore, by using Mo as an alloy with another metal, the difference in etching rate with respect to Al can be adjusted.

In another embodiment of the present invention, a protective metal film is made of Ti or a Ti alloy. Due to the protective metal film, an electrolytic solution such as a developer does not come into contact with Al and ITO simultaneously. Thus, electrolytic corrosion between Al and ITO can be prevented.

In the substrate of the reflection type liquid crystal display device of the present invention, a reflective electrode is in contact with a conductive portion through a protective metal film. Therefore, the reflective electrode will not be corroded by the reaction between the reflective electrode and the conductive portion.

In the substrate of a reflection type liquid crystal display device of the present invention, an output electrode of a switching element is made of at least one kind of material of a signal line. Therefore, a new step of forming the output electrode of the switching element is not required, and a process can be shortened.

According to the present invention, an output electrode is made of ITO, whereby the steps immediately before forming an interlayer insulator can be made similar to those of a transmission type liquid crystal display device, without decreasing an aperture ratio and the like of the transmission type liquid crystal display device.

According to the method for producing a liquid crystal display device of the present invention, a connecting electrode portion is made of at least two kinds of metal layers, and metal layers other than those which are to be a connecting electrode are removed after forming a reflective electrode material, whereby the metal layers to be the connecting electrode do not come into contact with the reflective electrode material in the course of producing a liquid crystal display device. Therefore, electrolytic corrosion between the connecting electrode and the reflective electrode material is prevented, and the connecting electrode can be protected from damage, and production yield can be enhanced.

Furthermore, in one embodiment of the present invention, the step of patterning a reflective electrode material and the step of removing metal layers, leaving at least one of at least two kinds of metal layers forming a connecting electrode portion are performed simultaneously by etching using the identical etchant. Thus, compared with the conventional method for producing a liquid crystal display device, production yield can be easily enhanced without increasing the number of production steps.

Furthermore, in another embodiment of the present invention, at least two kinds of metal layers forming a signal line and a connecting electrode portion are made of an ITO film, and one of Mo, an alloy containing Mo as its main component, Ta, and an alloy containing Ta as its main component, or a layered film thereof. Thus, a signal line can be formed of a layered structure of ITO and a metal layer without increasing the production steps, so that a wiring resistance can be decreased. Moreover, the connecting electrode can be formed of an ITO film, so that a high resistance caused by surface oxidation during the layer step can be prevented.

According to the method for producing a liquid crystal display device of the present invention, a photosensitive resin is used for an interlayer insulator, whereby patterning of the interlayer insulator can be completed only by photolithography, and the interlayer insulator with a sufficient thickness can be obtained easily.

Furthermore, according to the method for producing a liquid crystal display device of the present invention, a plurality of uneven shapes are formed on a surface of an interlayer insulator corresponding to a portion having a reflective function among pixel electrodes, whereby a reflective electrode having a light dispersion property can be easily produced, and a display quality of a liquid crystal display device can be substantially improved.

Thus, the invention described herein makes possible the advantages of: (1) providing a substrate of a reflection type liquid crystal display device capable of enhancing production yield; and (2) providing a method for producing the substrate.

These and other advantages of the present invention will become apparent to those skilled in the art upon reading and understanding the following detailed description with reference to the accompanying figures.

BRIEF DESCRIPTION OF THE DRAWINGS

FIG. 4A is a cross-sectional view of a layered electrode in the case where an Al/Mo layered structure is etched, and FIG. 4B is a cross-sectional view of an electrode with an Al/Mo layered structure in the case where Ti(Ta) is mixed into Mo or etching conditions are optimized.

FIG. 6A is a schematic plan view of a photomask for forming unevenness on an interlayer insulator, and FIG. 6B is a schematic plan view of a photomask for smoothing the interlayer insulator.

FIG. 11C1 is a cross-sectional view showing the state where the interlayer insulator floats in FIG. 11A, and FIG. 11C2 is a cross-sectional view showing the state where electrolytic corrosion occurs and the interlayer insulator floats in FIG. 11B.

FIG. 12A is a cross-sectional view showing the case where there is a gap between an interlayer insulator and a protective film, FIG. 12B is a cross-sectional view showing the case where an incised portion is formed in the protective film due to difference in step between the interlayer insulator and the terminal portion, and FIG. 12C is a cross-sectional view showing that electrolytic corrosion occurs and the interlayer insulator floats.

FIGS. 13A and 13B are cross-sectional views each showing the case where a gap is provided between a redundant line made of ITO and a connecting electrode made of ITO, using a method for producing a reflection type liquid crystal display device of the present invention, and FIG. 13C is a cross-sectional view showing the state where there is no electrolytic corrosion.

FIG. 16A is a cross-sectional view showing the vicinity of a TFT in FIG. 15, FIG. 16A' shows an enlarged contact hole portion, FIG. 16B is a perspective view showing a layered structure of an interlayer insulator and a reflective electrode, and FIG. 16B' shows an enlarged contact hole portion.

FIGS. 18A through 18J schematically show conventional steps of producing a substrate of a reflection type LCD and a substrate of a transmission type LCD: FIGS. 18A through 18D show the common steps of both the substrates; FIGS. 18E through 18G show the steps of forming a substrate of a reflection type LCD; and FIGS. 18H through 18J show the steps of forming a substrate of a transmission type LCD.

FIGS. 19A through 19C show the common steps of both the substrates; FIGS. 19D and 19E show the steps of forming a substrate of a reflection type LCD; and FIGS. 19F and 19G show the steps of forming a substrate of a transmission type LCD.

DESCRIPTION OF THE PREFERRED EMBODIMENTS

The present invention will be described with reference to FIGS. 1A through 1D and 2A through 2F.

In FIGS. 1A through 1D, 2A through 2F, and 3A through 3E, an interlayer insulator formed on a substrate is omitted for simplicity. A method for forming an interlayer insulator and the like will be described in Embodiment 4.

FIGS. 1A through 1D illustrate a problem to be solved by the present invention.

Figure 1A:
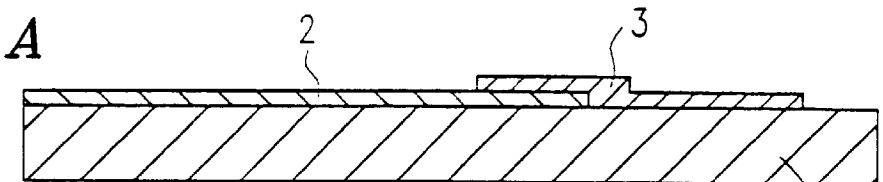
FIGS. 1A through 1D are cross-sectional views illustrating a problem to be solved by the present invention, illustrating the steps of corrosion generation in a terminal portion.

A terminal portion of a large liquid crystal display device and a liquid crystal display device (hereinafter, referred to as an "LCD") having active elements are roughly classified into a signal bus line 2 and a connecting electrode 3 for a signal input, as shown in FIG. 1A.

Figure 1B:
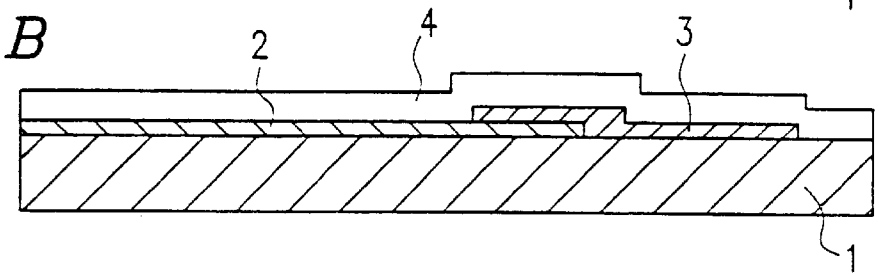

In the case where a reflection type LCD is produced so as to have such a terminal portion, a reflective electrode 4 is formed on the terminal portion, as shown in FIG. 1B, unless special processing such as mask deposition is performed. In general, Al is used for the reflective electrode 4 and ITO is used for the connecting electrode 3.

Figure 1C:
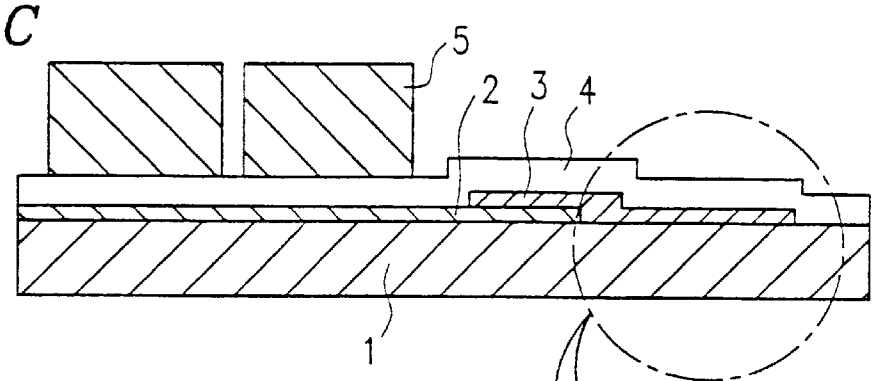
Figure 1C:
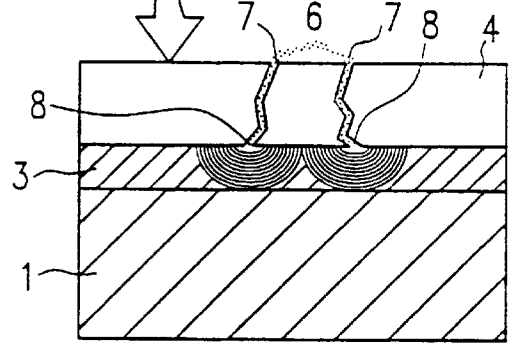

As described above, unlike a bulk substrate, a thin film generally has a number of pinholes 7 and the like, as shown in FIG. 1C', and is likely to be corroded by acid and alkali. Therefore, in the case where the reflective electrode 4 is patterned to a predetermined shape by photolithography, the reflective electrode 4 is corroded by a developer 6 which is an alkaline solution. At this time, the pinholes 7 and the like on the surface of the reflective electrode 4 is most likely to be affected by corrosion. The developer 6 passes through the pinholes 7 and the like, and comes into contact with the connecting electrode 3, as shown in FIG. 1C'. Reference numeral 5 in FIG. 1C denotes a photoresist. FIG. 1C' is a partially enlarged view (cross-sectional view) of FIG. 1C.

Figure 1D:
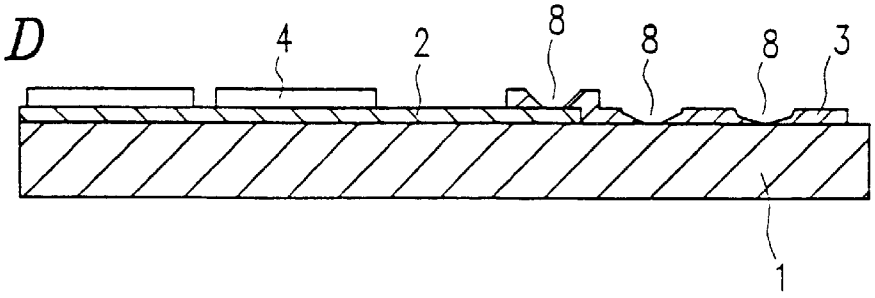
Figure 32A:
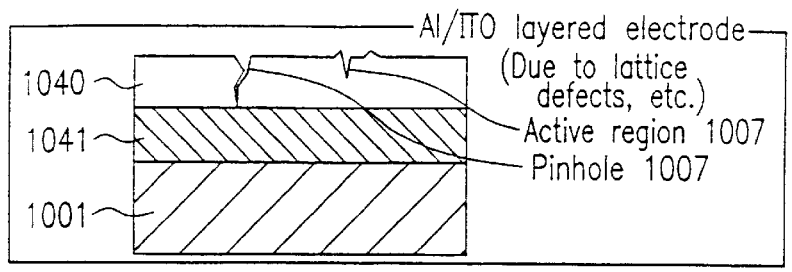
FIGS. 32A through 32C are cross-sectional views illustrating a problem of prior art.
Figure 32B:
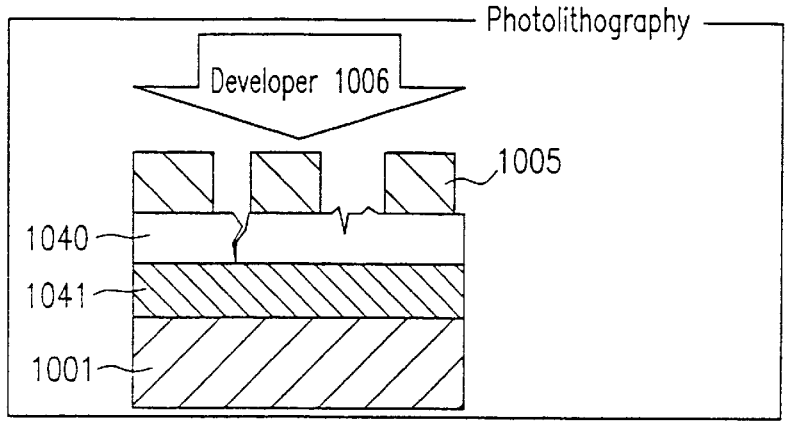
Figure 32C:
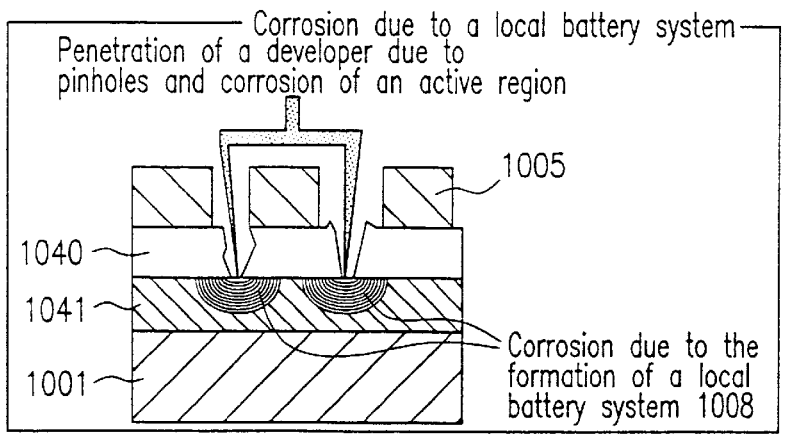
Figure 32D:
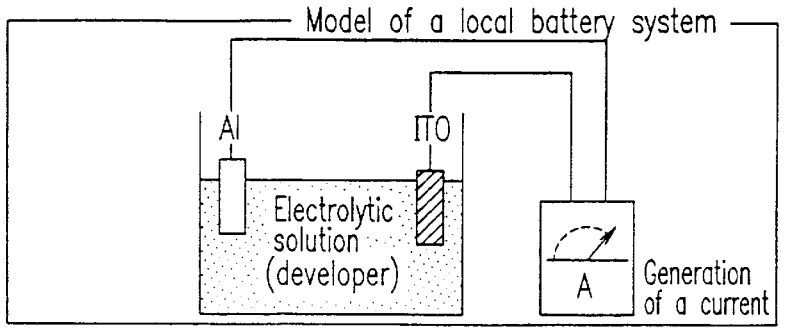
FIG. 32D is a schematic view showing a model of a battery system.

An Al/developer/ITO portion obtained by such a phenomenon forms a local battery system as shown in FIG. 32D, whereby the reflective electrode 4 and the connecting electrode 3 are both corroded as shown in FIG. 1D (hereinafter, this phenomenon is referred to as "electrolytic corrosion"). Reference numeral 8 in FIG. 1C' denotes a (electrolytically) corroded portion.

In order to avoid the above-mentioned problem, according to the present invention, a reflection type LCD is produced by using the steps shown in FIGS. 2A through 2F.

Figure 2A:
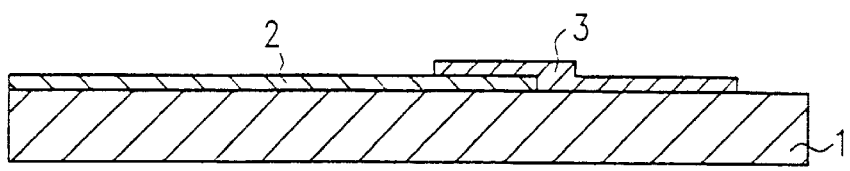
FIGS. 2A through 2F are cross-sectional views showing the steps of an exemplary method for producing a reflection type liquid crystal display device in Embodiments 1 and 2 according to the present invention.
Figure 2B:
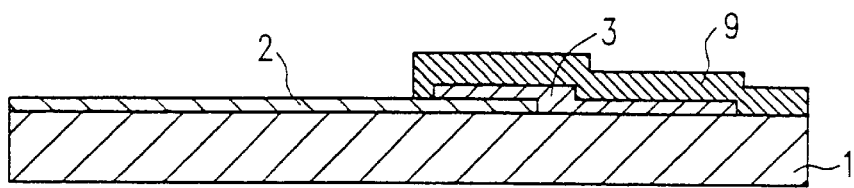
Figure 2C:
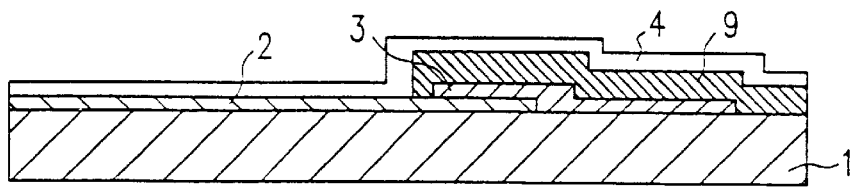

A terminal portion shown in FIG. 2A is similar to the conventional one shown in FIG. 1A, except that a protective film 9 is formed so as to cover at least an ITO film which is to be the connecting electrode 3 as shown in FIG. 2B before an Al film which is to be the reflective electrode 4 is formed (see FIG. 2C).

Figure 2D:
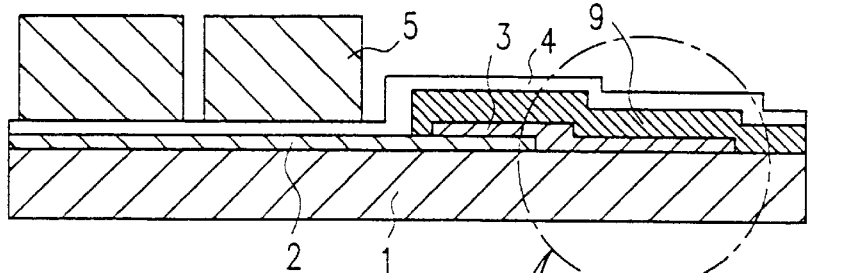
Figure 2D:
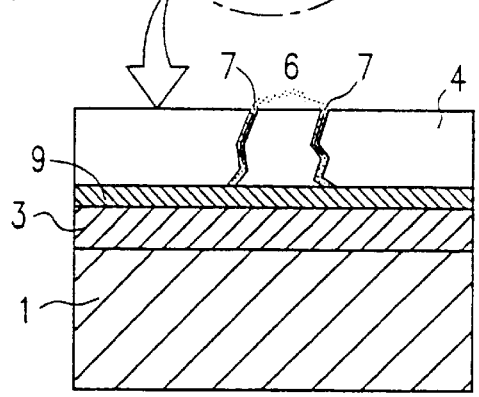
Figure 2E:
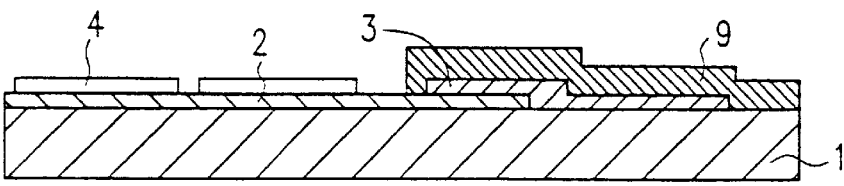
Figure 2F:
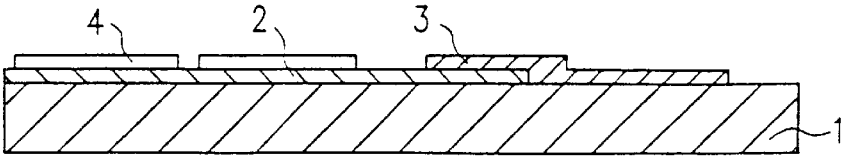

Because of the protective film 9, as shown in FIG. 2D', even when the developer 6 enters the reflective electrode 4 through the pinholes 7 and the like, the developer 6 does not pass through the protective film 9 to come into contact with the connecting electrode 3. FIG. 2D' is a partially enlarged view (cross-sectional view) of FIG. 2D. Therefore, even if an Al film which is to be the reflective electrode 4 is patterned as shown in FIG. 2E, the connecting electrode 3 will not be corroded, as shown in FIG. 2F.

Regarding the above-mentioned formation of the protective film 9, a method using a photosensitive resin material is described in Japanese Patent Application No. 9-160311. In the case of using a resin material, the resin material needs to be removed for a final configuration, which requires additional steps such as dry etching and ashing, accompanied by photolithography.

According to the present invention, by using a metal film as the protective film 9 and adopting an Al/protective metal film/ITO structure, the problem of electrolytic corrosion is overcome, and an increase in the number of steps of photolithography is prevented by appropriately selecting a protective metal film and an etchant.

Hereinafter, the present invention will be described by way of illustrative embodiments.

Embodiment 1

Embodiment 1 will be described with reference to FIGS. 2A through 2F.

As shown in FIG. 2A, a bus line 2 made of Ta and a connecting electrode 3 made of ITO are formed on a glass substrate 1. As shown in FIG. 2B, a Ti film is formed as a protective metal film 9 over the entire surface of the substrate 1 by sputtering. Then, the protective metal film 9 is patterned by photolithography, followed by etching in such a manner that the connecting electrode 3 is not exposed. An etchant containing EDTA, $H_2O_2$, and $NH_3$ is used so as to retain the etching selectivity of the bus line 2, the connecting electrode 3, and the protective metal film 9.

Then, as shown in FIG. 2C, an Al film is formed as the reflective electrode 4. A photoresist 5 having a predetermined shape is formed by photolithography as shown in FIG. 2D, followed by etching with a solution containing nitric acid, acetic acid, phosphoric acid, and water. Thereafter, the photoresist 5 is removed as shown in FIG. 2E, and the protective metal film 9 covering the connecting electrode 3 is removed with the above-mentioned etchant containing EDTA, $H_2O_2$, and $NH_3$ as shown in FIG. 2F. Thus, the connecting electrode 3 is exposed.

The selectivity between each metal material and the etchant used in the present embodiment is as shown in the following Table 1. As shown in Table 1, the Ti etchant acts on Ti but not on the other metal, and the Al etchant acts on Al but not on the other metal.

TABLE 1

|  | Ta | ITO | Ti | Al |
| --- | --- | --- | --- | --- |
| EDTA + $H_2O_2$ + $NH_3$ | Not etched | Not etched | Etched | Not etched |
| Nitric acid + acetic acid + phosphoric acid + water | Not etched | Not etched | Not etched | Etched |

By adopting the above-mentioned etchants and metal materials, and including the steps of forming and removing the protective metal film 9 in the production process, a reflective LCD can be produced without causing electrolytic corrosion of the connecting electrode 3 and the reflective electrode 4.

The above-mentioned combination is merely an example. As long as the similar effects are obtained, the combination is not limited to that in the present embodiment.

Embodiment 2

In Embodiment 1, Ti is used for the protective metal film 9, and a solution containing EDTA, $H_2O_2$, and $NH_3$ is used as an etchant. However, considering the strong volatility of $H_2O_2$ and $NH_3$, this etchant is not suitable for industrial production. In the present embodiment, the process adopting Mo for the protective metal film 9 will be described with reference to FIG. 2A through 2F.

The same steps as those in Embodiment 1 are performed, and a Mo layer is formed as the protective metal film 9 so as to cover the connecting electrode 3 made of ITO in the terminal portion (see FIGS. 2A and 2B), and an Al film is formed as the reflective electrode 4 (see FIG. 2C). Thereafter, as shown in FIG. 2D, the photoresist 5 having a predetermined shape is formed by photolithography, and the reflective electrode 4 is etched with an etchant. At this time, the protective metal film 9 is also etched with the same etchant.

Therefore, an etching step for removing the protective metal film 9 is not required after forming the reflective electrode 4 as in Embodiment 1, which decreases the number of etching steps. More specifically, the step shown in FIG. 2E of removing the protective metal film 9 is not required, and the final configuration (FIG. 2F) is obtained after the completion of the Al etching.

The selectivity between each metal material and the etchant in the present embodiment is shown in the following Table 2.

TABLE 2

|  | Ta | ITO | Mo | Al |
| --- | --- | --- | --- | --- |
| Nitric acid + Acetic acid + phosphoric acid + water | Not etched | Not etched | Etched | Etched |

The above-mentioned combination is merely an example. As long as the similar effects are obtained, the combination is not limited to that in the present embodiment.

Embodiment 3

Embodiment 3 will be described with reference to FIGS. 3A through 3E and 4A and 4B.

Figure 3A:
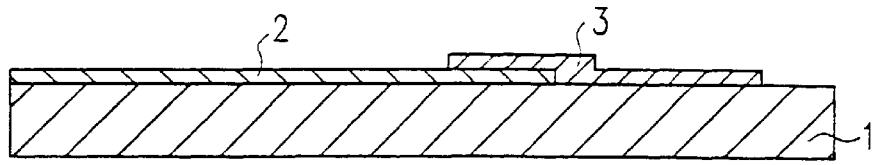
FIGS. 3A through 3E are cross-sectional views showing the steps of an exemplary method for producing a reflection type liquid crystal display device in Embodiment 3 according to the present invention, in the case where the entire substrate as well as a connecting electrode are covered with a protective film, corrosion is prevented by optimizing the combination of a reflective electrode, a protective metal film, and an etchant, and the number of steps is shortened.

In the present embodiment, a bus line 2 made of Ta and a connecting electrode 3 made of ITO are formed on a glass substrate 1 as shown in FIG. 3A. A Mo film is formed as a protective metal film 9 on the glass substrate 1, and an Al layer is formed as a reflective electrode 4 (see FIGS. 3B and 3C). The Al/Mo layered metal film (reflective electrode 4 and protective metal film 9) thus formed is patterned to a predetermined shape by photolithography (see FIG. 3D). At this time, as shown in FIG. 3D', the protective metal film 9 prevents a developer 6 from entering the connecting electrode 3. The resultant substrate is etched with an etchant containing nitric acid, acetic acid, phosphoric acid, and water, whereby Al and Mo are both etched as shown in Table 2 to obtain a final configuration shown in FIG. 3E.

Accordingly, by forming the protective metal film 9 in the similar manner to that of the reflective electrode 4, and by using a combination which enables Al and Mo to be etched with the same etchant, the step of previously forming the protective metal film 9 so as to cover the connecting electrode 3 as in Embodiments 1 and 2 is not added, whereby one photolithography step can be omitted.

Figure 3B:
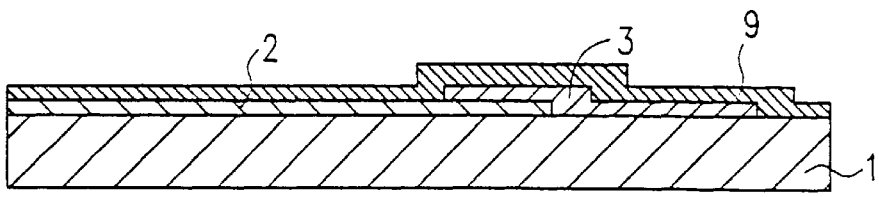
Figure 3C:
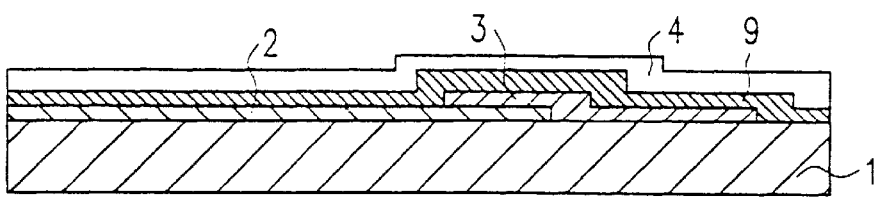
Figure 3D:
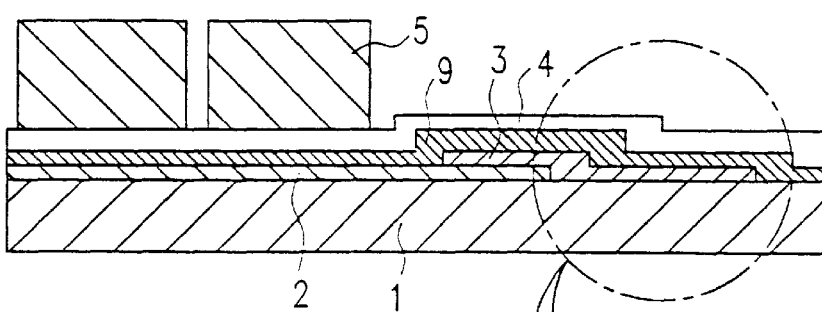
Figure 3D:
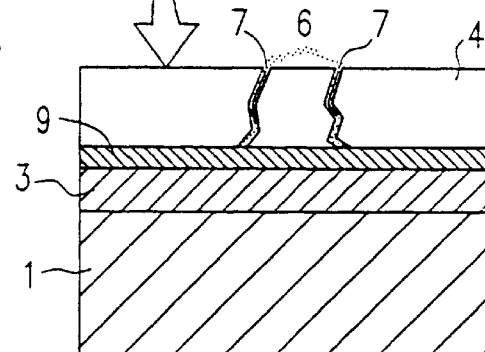
Figure 3E:
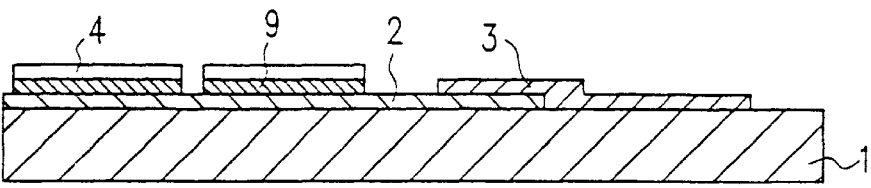

Furthermore, if Mo and Al are continuously deposited in the course of forming films, it is not required to consider the step shown in FIG. 3B, and the configuration shown in FIG. 3C is obtained directly from that shown in FIG. 3A. In this case, while the number of steps is equal to that of the process not using a protective film as described with reference to FIG. 1, the connecting electrode 3 can be prevented from corrosion.

The production steps in Embodiment 3 are merely exemplary. Any combination of materials can be used, as long as it retains the selectivity with respect to metal such as other lines, and the materials can be simultaneously etched. Furthermore, as shown in FIG. 4A, the problem of a reverse-tapered cross-section caused by the difference in etch rate between an Al electrode 38 and a Mo film 37 can be overcome by optimizing the etching condition. Furthermore, metal such as Ta and Ti is mixed with Mo so as to adjust the etch rate, whereby a configuration as shown in FIG. 4B can be realized. Reference numeral 39 shown in FIG. 4B denotes an alloy layer of Mo and Ta (or Ti).

Embodiment 4

In Embodiment 4, the case where a reflection type LCD using TFTs as switching elements is produced by the steps of the present invention will be described with reference to FIGS. 5A through 14B.

Figure 5A:
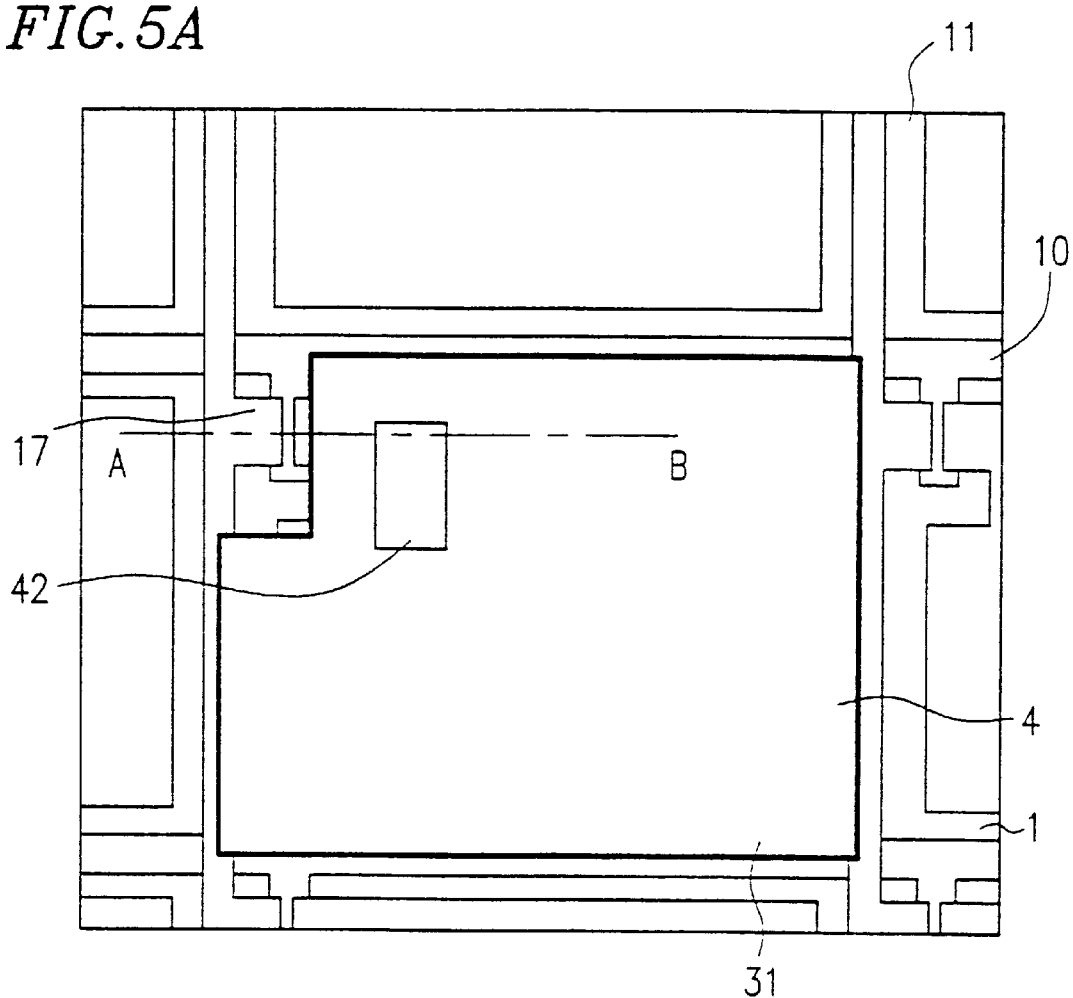
FIG. 5A is a top view showing a structure of a substrate using a TFT as a switching element.
Figure 5B:
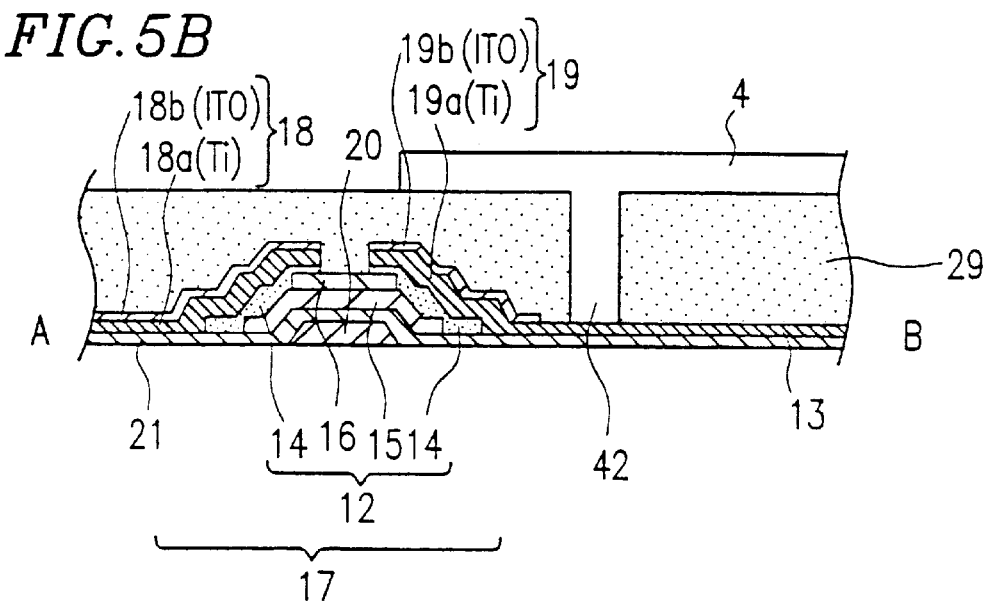
FIG. 5B is a cross-sectional view taken along a line A-B in FIG. 5A.
Figure 7A:
FIGS. 7A through 7I are cross-sectional views showing the steps of forming unevenness on an interlayer insulator.
Figure 7B:
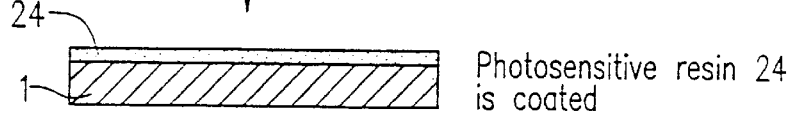
Figure 7C:
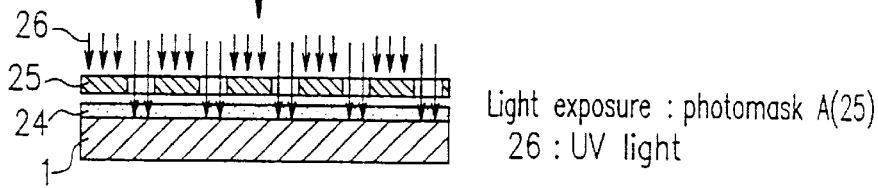
Figure 7D:
Figure 7E:
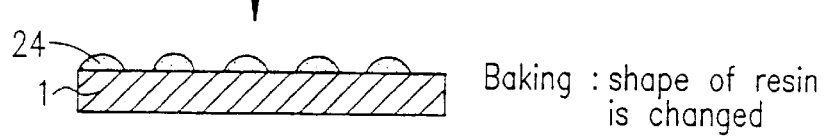
Figure 7F:
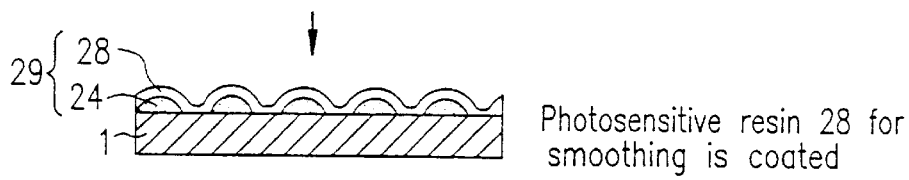
Figure 7G:
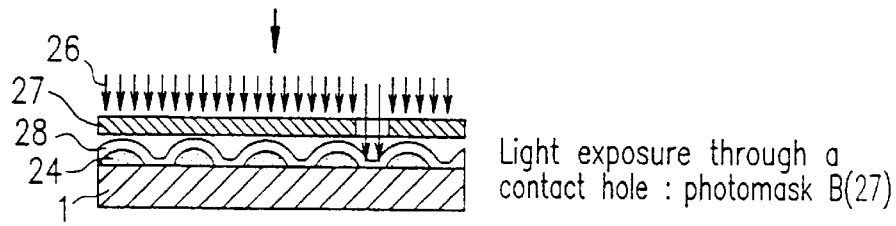
Figure 7H:
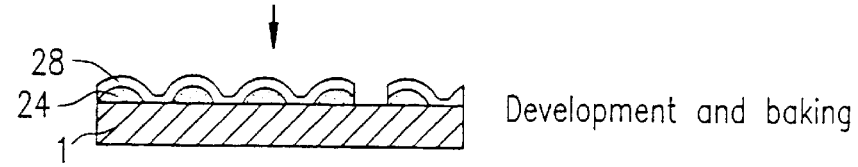
Figure 7I:
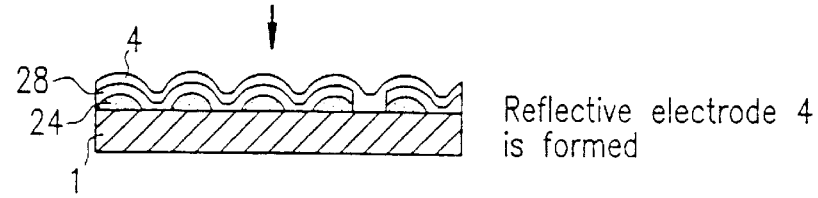

FIG. 5A is a plan view of one pixel of a device side substrate, and FIG. 5B is a cross-sectional view taken along a line A-B in FIG. 5A.

In FIG. 5A, reference numeral 1 denotes a glass substrate, 10 denotes a gate bus line, 11 denotes a source bus line, 17 denotes a TFT element, and 4 denotes a pixel electrode (reflective electrode) which also functions as a reflective plate.

On the TFT device side substrate, as shown in FIG. 5B, a gate electrode 20 made of a Ta thin film, a gate insulating film 21 made of SiNx, a semiconductor layer 12 (i-layer 15, n$^+$-layer 14, and an etch stopper 16), a source electrode 18 formed of a Ti electrode 18$a$ and an ITO electrode 18$b$, and a drain electrode 19 formed of a Ti electrode 19$a$ and an ITO electrode 19$b$ are formed on the glass substrate 1, which forms the TFT element 17. The reflective electrode 4 formed on an interlayer insulator 29 is electrically connected to a lower pixel electrode 13 through a contact hole 42, and the lower pixel electrode 13 is electrically connected to a drain electrode 19.

The steps of forming the TFT element 17 on the device side substrate and forming a connecting electrode 3 made of ITO in a gate terminal portion and a source terminal portion are the same as those in the conventional LCD. Therefore, the description thereof is omitted here. Furthermore, the steps of forming unevenness on the interlayer insulator 29 so as to give a light diffusion property to the reflective electrode 4 are described in Japanese Laid-open Publication No. 6-75238. Therefore, the detailed description thereof is omitted here. FIGS. 6A and 6B are schematic diagrams of a photomask A 25 and a photomask B 27 used for forming unevenness, and FIGS. 7A through 7I schematically illustrate the steps of forming unevenness. It should be noted that the scales of the photomask A 25 and the photomask B 27 are regulated for easy understanding. Therefore, the intervals of each pattern are not necessarily identical with each other.

When the reflective electrode 4 is formed on the interlayer insulator 29 provided with minute unevenness, using a photosensitive resin, by any procedure described in Embodiments 1 through 3, a substrate with the reflective electrode 4 can be obtained by a simple method without corroding the connecting electrode 3 made of ITO and the reflective electrode 4 made of Al. The production steps of the present invention can be made more effective by using the following procedures.

Figure 8A:
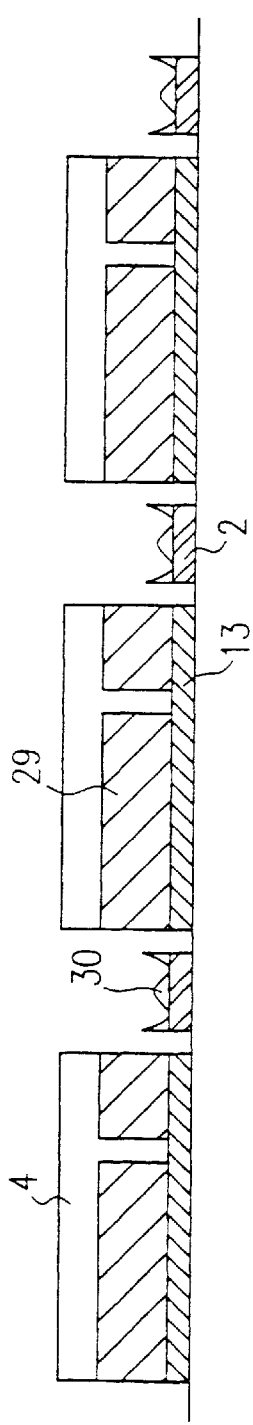
FIG. 8A is a cross-sectional view illustrating a problem caused by the difference in a formation range of an interlayer insulator in the case where the corrosion of a redundant line made of ITO is not considered.
Figure 8B:
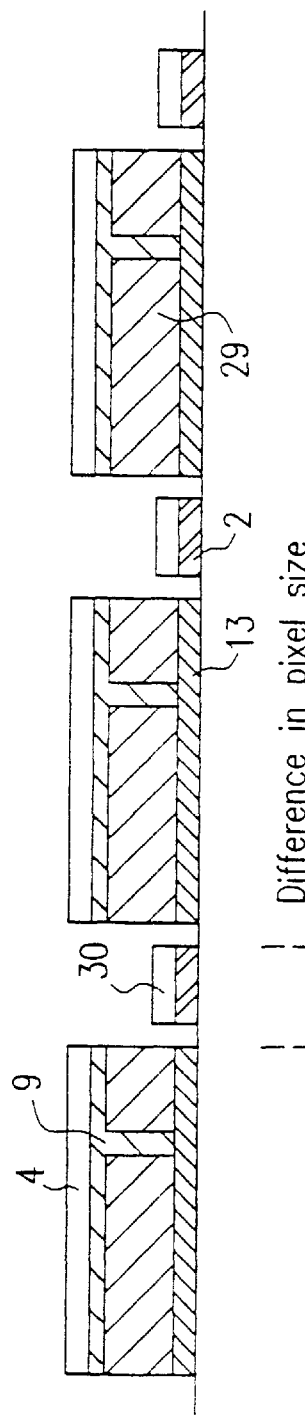
FIG. 8B is a cross-sectional view illustrating a problem caused by the difference in a formation range of an interlayer insulator in the case where the corrosion of a redundant line made of ITO is considered.
Figure 8C:
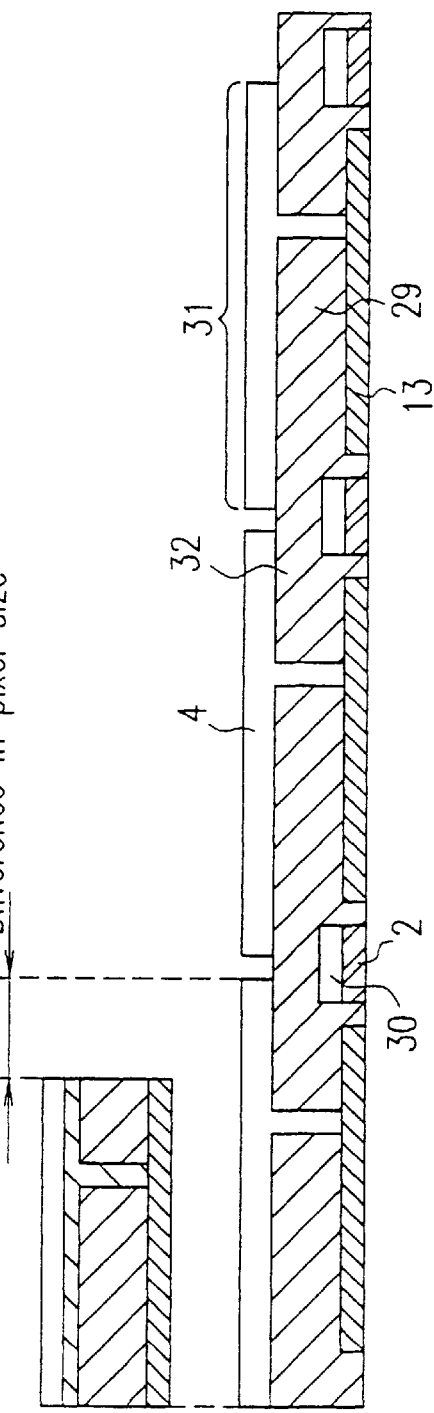
FIG. 8C is cross-sectional view illustrating a problem caused by the difference in a formation range of an interlayer insulator in the case where a bus line as well as a lower pixel electrode are covered with an interlayer insulator.

1) An area of the interlayer insulator 29 is prescribed to be equal to or larger than a display area 31 (see FIG. 10), and as shown in FIG. 8C, the interlayer insulator 29 is formed so as to be present between the lower pixel electrodes 13.

2) As shown in FIGS. 13A through 14B, a bus line 2 or a redundant line 30 made of ITO which is used as a redundant line for the bus line 30 are formed within the interlayer insulator 29.

3) An interval equal to or larger than a shift amount due to the positional shift margin of light exposure means and the overetching during etching is provided between the connecting terminal 3 made of ITO and the redundant line 30 of the bus line 2 (see FIG. 8C).

The effects of the above procedures 1) to 3) will be described with reference to FIGS. 8A through 14B. In these figures, for simplicity, unevenness to be formed on the interlayer insulator 29 is not shown.

In general, a double-line (redundant design for defects caused by disconnection and the like) is used as the signal bus line 2, and ITO may be used for the redundant line 30. Like the above-mentioned terminal portion, it is required to consider the corrosion of the redundant line 30 and the reflective electrode 4. If the production steps proceed without considering the corrosion, ITO of the redundant line 30 will be corroded as shown in FIG. 8A. However, the corrosion of the redundant line 30 can be prevented in the same way as in the terminal portion. Thus, a final configuration of the redundant line 30 without being corroded can be obtained as shown in FIG. 8B. In this case, the reflective electrode has substantially the same size as that of a pixel electrode in the conventional transmission type LCD.

The reflection type LCD thus obtained performs a display by reflecting light from a front surface. It is generally well-known that in the case where the reflective electrode 4 is formed so as to be adjacent to a liquid crystal layer, a higher aperture ratio can be obtained by forming the reflective electrode 4 even on the gate bus line 10 and the source bus line 11 (corresponding to the bus line 2 in FIG. 8C) formed on the device side substrate. When the case where the reflective electrode 4 is not formed on the redundant line 30 is compared with the case where the reflective electrode 4 is formed even on the redundant line 30, there is a big difference in area of the reflective electrode 4 as shown in FIG. 8C. This difference is directly reflected onto display brightness of an LCD. Therefore, it is preferable that the reflective electrode 4 is formed even on the bus line 2 and/or the redundant line 30.

Next, regarding the display area 31 and the area covered with the interlayer insulator 29, it is required that the redundant line 30 made of ITO of the bus line 2 should be considered.

Figure 9:
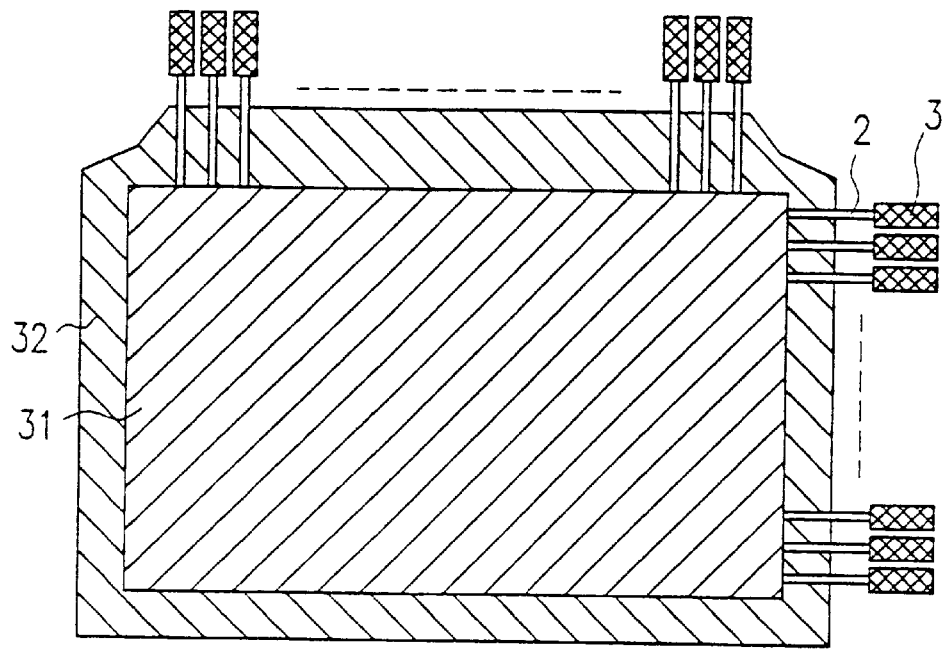
FIG. 9 is a plan view showing the entire liquid crystal panel.

FIG. 9 shows a reflection type LCD having an insulating layer region 32 also formed in a region other than the display area 31. In this LCD, as shown in FIG. 10, ITO used for the redundant line of the bus line 2 and ITO used for the connecting electrode 3 are integrally formed to provide an ITO electrode 33.

Figure 10:
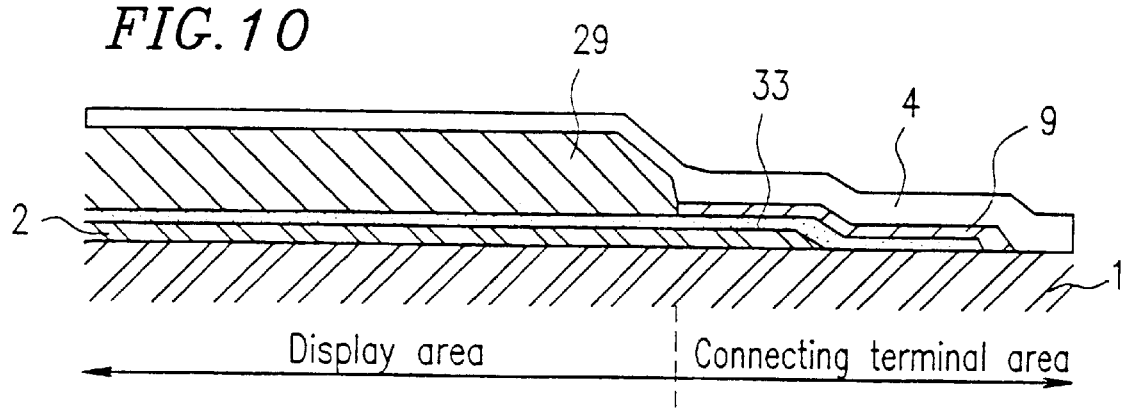
FIG. 10 is a cross-sectional view showing the state where an interlayer insulator and a protective film are ideally covering an ITO electrode.

In the case of using the procedures described in Embodiments 1 and 2, an end portion in the vicinity of a terminal of the interlayer insulator 29 after formation of the reflective electrode 4 ideally has a cross-section in such a manner that the interlayer insulator 29 and a protective film 9 cover the ITO electrode 33 without any gap as shown in FIG. 10.

However, in an actual production process, when the interlayer insulator 29 and the protective film 9 are formed to a predetermined shape, shifts from designed values occur due to a positional shift at light exposure during photolithography, overetching during etching, etc. This causes the following problems.

Figure 11A:
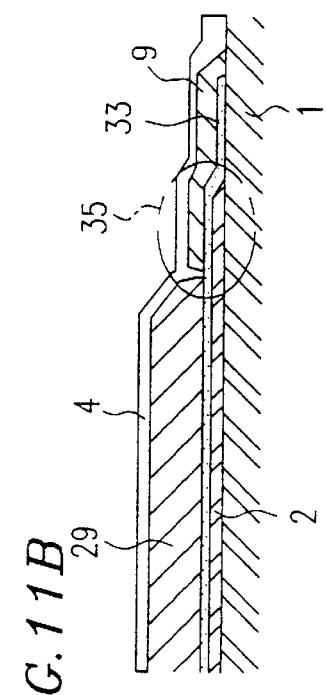
FIG. 11A is a cross-sectional view showing the case where a protective film comes under an interlayer insulator.

(1) In the case where the protective film 9 is formed before the interlayer insulator 29 is formed, a portion 34, in which the protective film 9 comes under the interlayer insulator 29, is formed as shown in FIG. 11A.

Figure 11B:
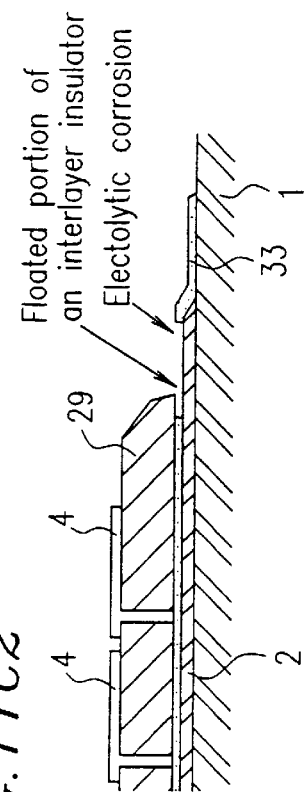
FIG. 11B is a cross-sectional view showing the case where there is a gap between the interlayer insulator and the protective film.

(2) Furthermore, as shown in FIG. 11B, a gap 35 is formed between the interlayer insulator 29 and the protective film 9.

As a result, in the case of FIG. 11A, a floated portion is formed in the interlayer insulator 29 when the protective film 9 is removed (see FIG. 11C1). In the case of FIG. 11B, the ITO electrode 33 is exposed in the gap 35 between the interlayer insulator 29 and the protective film 9 (before the reflective electrode 4 made of Al is formed), and the reflective electrode 4 comes into contact with the ITO electrode 33 to cause electrolytic corrosion (see FIG. 11C2).

The above-mentioned floated portion of the interlayer insulator 29 may cause "peeling of the film" during the later temperature rasing step and the like, which remarkably decreases production yield and reliability.

Furthermore, even in-the case where the protective film 9 is formed after formation of the interlayer insulator 29, there is a possibility that defects as shown in FIGS. 12A through 12C may occur, irrespective of whether or not the protective film 9 is patterned.

FIG. 12A shows the case where the gap 35 is formed between the interlayer insulator 29 and the protective film 9, and the ITO electrode 33 is exposed in the gap 35 in the same way as in FIG. 11B. FIG. 12B shows the case using the procedure in Embodiment 3, in which a cutaway portion 36 of the protective film 9 is formed due to the difference in step between the interlayer insulator 29 and the terminal portion. The ITO electrode 33 is exposed in the cutaway portion 36 in the same way as in the gap 35, which causes electrolytic corrosion (see FIG. 12C).

Figure 14A:
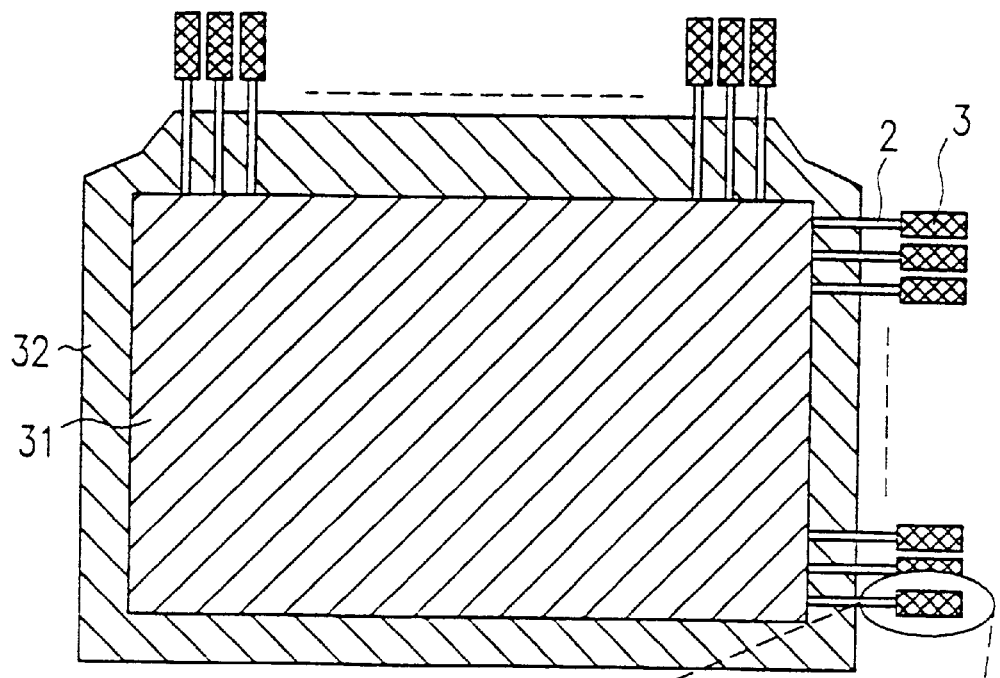
FIG. 14A is a plan view of FIG. 13C showing an observed portion.
Figure 14B:
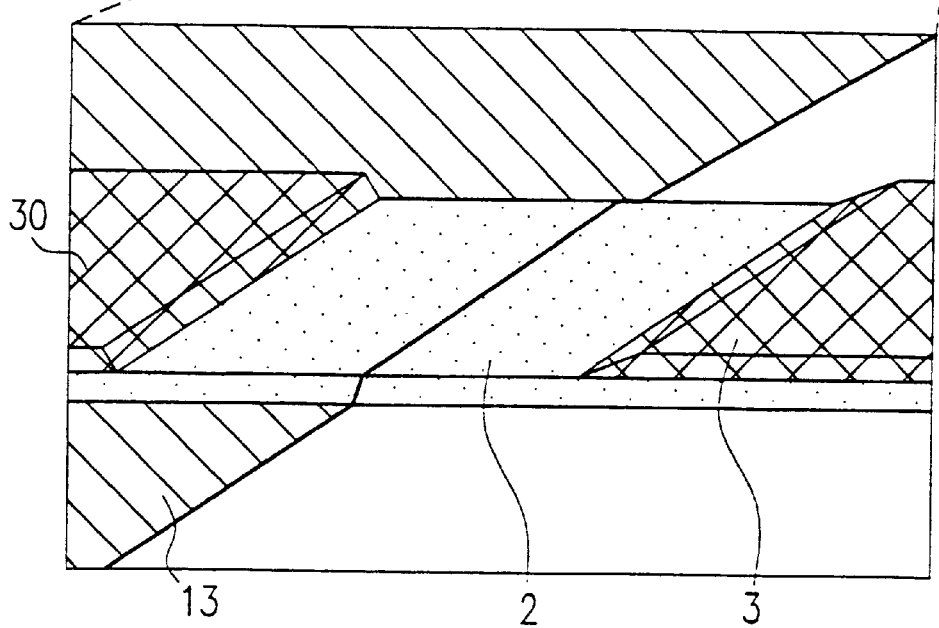
FIG. 14B is a perspective view of the observed portion in FIG. 14A.

In order to prevent the above-mentioned problem, the above-mentioned procedures 1) to 3) are effective. In this case, the ITO electrode 33 in the gap 35 between the interlayer insulator 29 and the protective film 9 shown in FIG. 13A and the ITO electrode 33 in the cutaway portion 36 formed due to the difference in step shown in FIG. 13B are previously removed. Thus, the ITO electrode 33 is separated into the redundant line 30 made of ITO and the connecting electrode 3 made of ITO, whereby electrolytic corrosion can be prevented (see FIG. 13C). FIG. 14B is a perspective view (the interlayer insulator 29 is omitted) of FIG. 13C, and FIG. 14A is a plan view showing an observed portion thereof.

When the insulating layer region 32 is present outside the display area 31, the following effects are obtained. An ITO film which is the redundant line 30 is left in a wider range, enhancing redundancy. In addition, even when cracks, pinholes, and the like are generated in an end portion of the interlayer insulator 29, corrosion toward the underneath of the display area 31 can be prevented from proceeding to some degree.

In the present embodiment, TFTs are used as active elements, and a photosensitive resin is used as the interlayer insulator. However, the present invention is not limited thereto. For example, even when a two-terminal element such as a MIM element is used, the same effects can be obtained. Furthermore, the effects of the present invention will not be influenced by the kind of a material for the interlayer insulator. Furthermore, in the present embodiment, unevenness is formed on the interlayer insulator for the purpose of giving a light dispersion property to the reflective electrode. However, the surface shape of the interlayer insulator does not influence the production means of the present invention. Thus, the interlayer insulator may be flat, for example.

As described above, the steps of forming the TFT element 17 on the device side substrate, and the connecting electrode 3 made of ITO in the gate terminal portion and the source terminal portion in the present embodiment are the same as those in the conventional LCD. However, in the conventional production process, the pixel electrode is made of ITO, which gives light transparency but generally has a higher electric resistance compared with the other metal. In contrast, in the case of the reflection type LCD of the present invention, the reflective electrode 4 and the lower pixel electrode 13 need not have light transparency. Therefore, the reflective electrode 4 and the lower pixel electrode 13 may be made of metal films with a lower resistance. In the present embodiment, as shown in FIG. 5B, the metal film (Ti) used for the source electrode 18a and the drain electrode 19a of the TFT is used for the lower pixel electrode 13 electrically connected to the reflective electrode 4.

Embodiment 5

In Embodiment 4, the reflection type LCD is not required to transmit light from a back surface, so that the lower electrode is made of an opaque metal film to have a lower resistance.

However, in the case where a substrate of a reflection type LCD and a substrate of a transmission type LCD are used together, when a metal film is used for the lower electrode, the lower electrode blocks light from the back surface, which decreases an aperture ratio in a pixel portion in the substrate of the transmission type LCD. In contrast, when transparent ITO is used for the lower electrode, electrolytic corrosion is caused between the lower electrode and the reflective electrode in the substrate of the reflection type LCD. The only way to avoid this problem is that the substrate of the reflection type LCD and the substrate of the transmission type LCD are separately produced, which decreases mass-productivity. More specifically, in the conventional example, electrolytic corrosion between the lower electrode and the reflective electrode in the substrate of the reflection type LCD cannot be prevented while an aperture ratio in the pixel portion in the substrate of the transmission type LCD being sufficiently increased. This makes it impossible to use the substrate of the reflection type LCD together with the substrate of the transmission type LCD.

Figure 15:
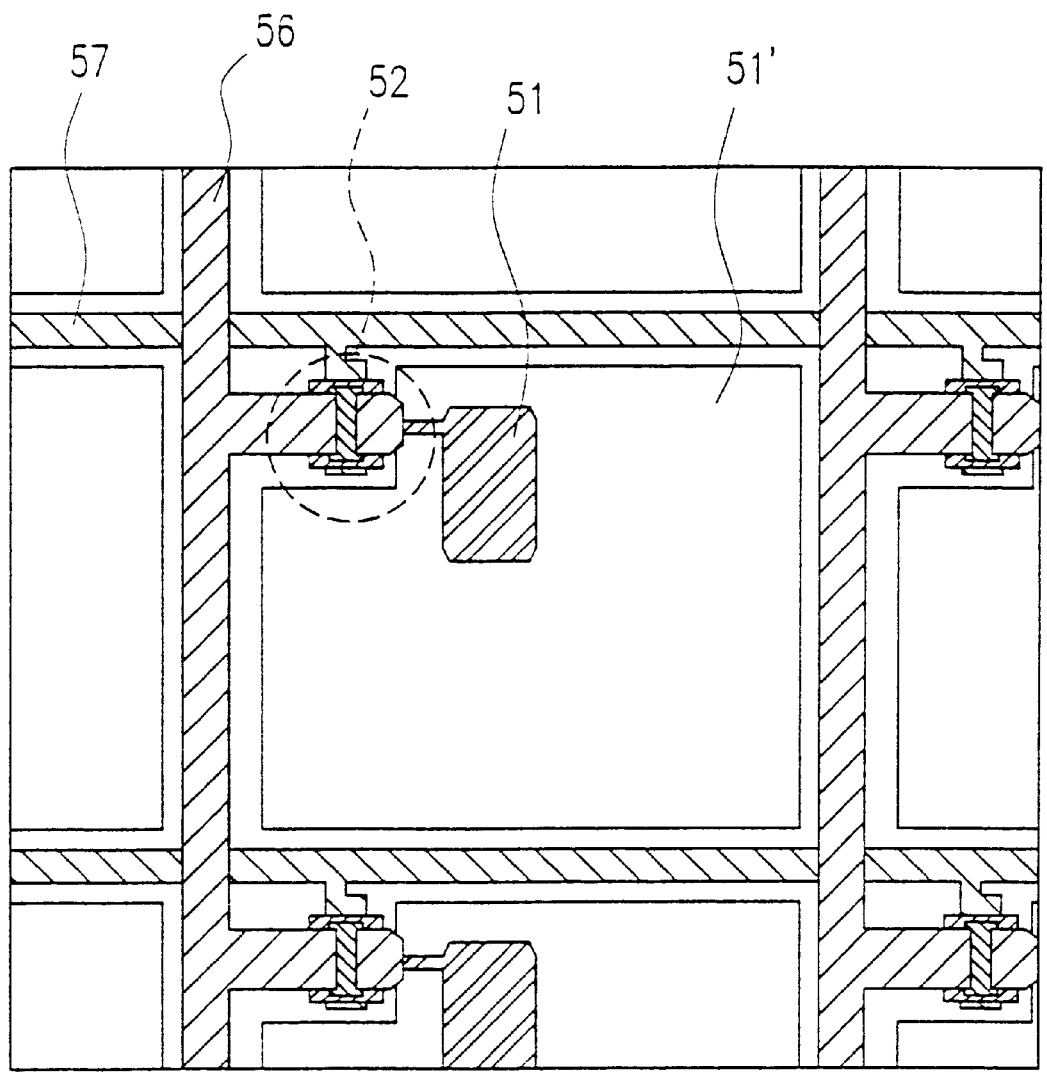
FIG. 15 is a plan view schematically showing one pixel portion on a conventional substrate.

FIG. 15 schematically shows one pixel in a conventional substrate having a contact electrode which is connected to a pixel electrode. In FIG. 15, a contact electrode 51 is connected to an output side of a TFT 52, and is also connected to a lower pixel electrode 51'. Respective signal lines 56 and 57 define a plurality of pixel regions. The lower pixel electrode 51' is disposed in each pixel region.

FIG. 16A shows a structure of a cross-section in the vicinity of the lower pixel electrode 51' and the TFT 52. The interlayer insulator 54 and the reflective electrode 53 are successively formed on the contact electrode 51 and the TFT 52 as shown in FIG. 16B. The reflective electrode 53 is connected to the contact electrode 51 through a contact hole 54a of the interlayer insulator 54. The pixel electrode 51, the TFT 52 and the like are formed on the substrate 58 via an insulating film 59.

As shown in FIG. 16A', pinholes and cracks 55 may be generated in a portion of the contact hole 54a. Herein, in addition to the lower pixel electrode 51', metal without light transparency is adopted for the contact electrode 51. Therefore, even when an electrolytic solution enters through the pinholes and cracks, the contact electrode 51 functions as a protective metal film, thereby preventing electrolytic corrosion between the lower pixel electrode 51' and the reflective electrode 53.

Figure 17A:
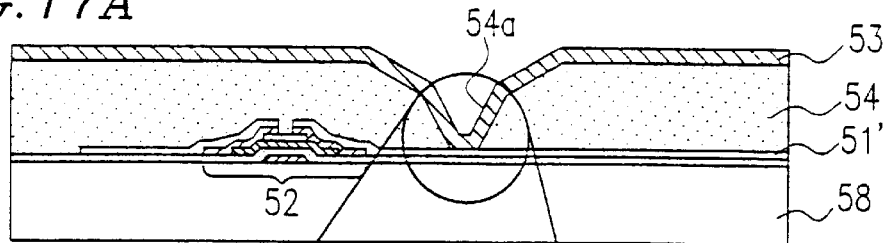
FIG. 17A is a cross-sectional view showing the vicinity of a TFT in another conventional substrate, FIG. 17A' shows an enlarged contact hole portion.
Figure 17A:
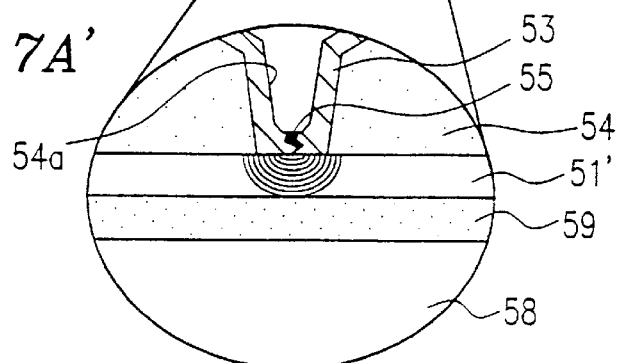
Figure 17B:
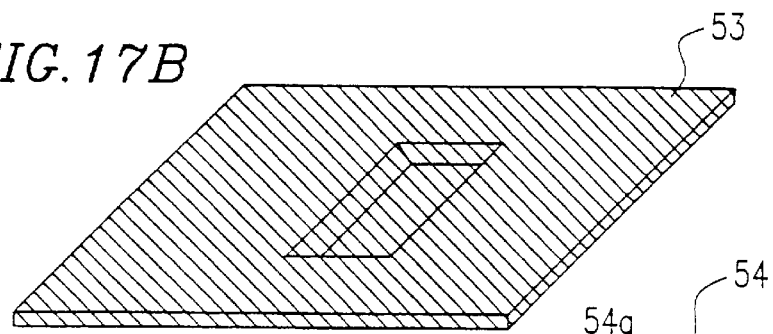
FIG. 17B is a perspective view showing a layered structure of an interlayer insulator and a reflective electrode, and FIG. 17B' shows an enlarged contact hole portion.
Figure 17B:
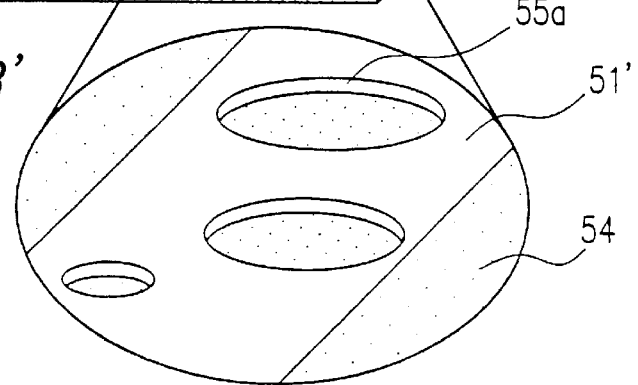

Although the substrate with the above-mentioned structure is suitable for a reflection type LCD, it is not suitable for a transmission type LCD since an aperture ratio in a pixel portion of the transmission type LCD is decreased by the opaque contact electrode 51. If the lower pixel electrode 51' is provided with a function of the contact electrode 51 without forming the contact electrode 51, and transparent ITO is adopted for the lower pixel electrode 51', pinholes and cracks are formed in the reflective electrode 53 at the contact portion 54a as shown in FIG. 17A', and electrolytic corrosion occurs between the lower pixel electrode 51' and the reflective electrode 53 as shown in FIG. 17B, forming a large hole 55a. When the corroded portion further spreads, the lower pixel electrode 51' disappears from the entire contact hole 54a in the worst case, resulting in electrical disconnection between the lower pixel electrode 51' and the reflective electrode 53. Therefore, in the conventional example, only a part of the production steps can be shared by the substrate of the reflection type LCD and the substrate of the transmission type LCD.

In the transmission type LCD, a transparent electrode of ITO is disposed as an upper electrode in place of the reflective electrode 53 which corresponds to an upper electrode in the reflection type LCD. Therefore, even when ITO of the pixel electrode 51' is used for the contact electrode, and the contact electrode is connected to the upper electrode, electrolytic corrosion does not occur between the transparent electrode which is the upper electrode and the pixel electrode which also functions as the contact electrode.

FIGS. 18A through 18J schematically illustrate conventional steps of producing a substrate of a reflection type LCD and a substrate of a transmission type LCD. As shown in FIGS. 18A through 18D, a gate electrode 65, a gate insulating film 66, a TFT (consisting of an i-Si layer 67, a n$^+$-Si layer 68, a channel protective layer 69), and a Ti metal film 71 to be a source electrode, a drain electrode, and the like are successively formed on a substrate 64. The hitherto steps are shared by the substrate of the reflection type LCD and the transmission type LCD.

FIGS. 18E through 18G show the steps of producing the substrate of the reflection type LCD. As shown in FIGS. 18E through 18G, a pixel electrode 72, a first source electrode 73, and a first drain electrode 74 are formed of the metal film 71. Then, an ITO film 75 is formed on the pixel electrode 72, the first source electrode 73, and the first drain electrode 74. A second source electrode 76 and a second drain electrode 77 are formed of the ITO film 75.

FIGS. 18H through 18J show the steps of producing the substrate of the transmission type LCD. As shown in FIGS. 18H through 18J, a first source electrode 73 and a first drain electrode 74 are formed of the metal film 71. Then, an ITO film 75 is formed on the first source electrode 73 and the first drain electrode 74, and a second source electrode 76 and a second drain electrode 77 are formed of the ITO film 75.

In the case of the substrate of the reflection type LCD, in order to prevent electrolytic corrosion between the reflective electrode and the pixel electrode 72, the pixel electrode 72 connected to the reflective electrode made of Al is formed of the metal film 71. Furthermore, in the case of the substrate of the transmission type LCD, in order to increase an aperture ratio in a pixel portion, the pixel electrode 78 is formed of the transparent ITO film 75. As is apparent from the description with reference to FIGS. 17A through 17B', two or more kinds of photomasks which cannot be shared by the substrate of the reflection type LCD and the substrate of the transmission type LCD are required.

Herein, a Ti metal film is used for the first source electrode and the first drain electrode, and an ITO film is used for the second source electrode and the second drain electrode. However, any other kind of metal which has a low resistance may be used for the first layers, and an ITO film may be used for the first layers.

Figure 19A:
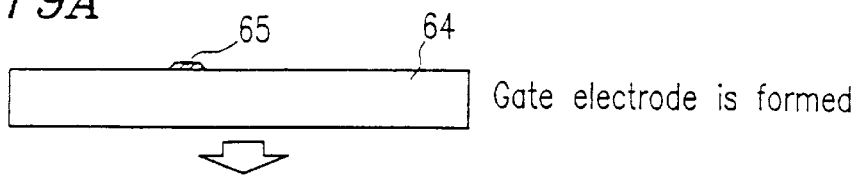
FIGS. 19A through 19G schematically show alternative conventional steps of producing a substrate of a reflection type LCD and a substrate of a transmission type LCD.
Figure 19B:
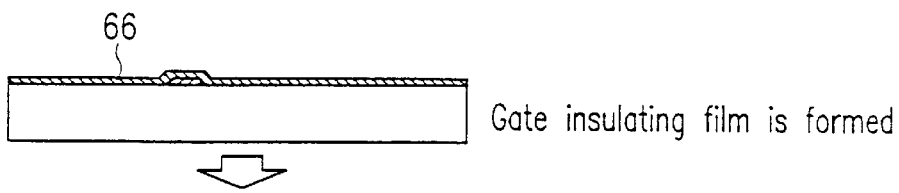
Figure 19C:
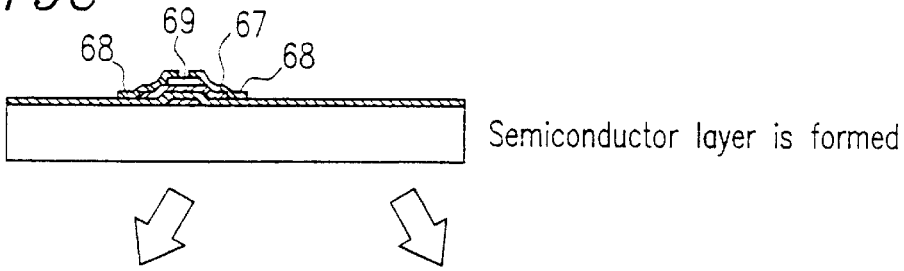

FIGS. 19A through 19G schematically show an example of further simplified conventional steps of producing a substrate of a reflection type LCD and a substrate of a transmission type LCD, i.e., an example in which a source electrode and a drain electrode are formed of only one layer. As shown in FIGS. 19A through 19C, a gate electrode 65, a gate insulating film 66, a TFT (consisting of an i-Si layer 67, a n$^+$-Si layer 68, and a channel protective layer 69) are successively layered on a substrate 64. The hitherto steps are shared by the substrate of the reflection type LCD and the substrate of the transmission type LCD.

Figure 19D:
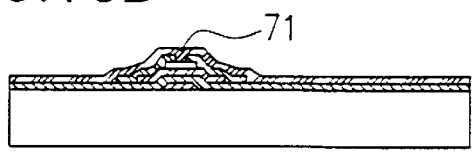
Figure 19F:
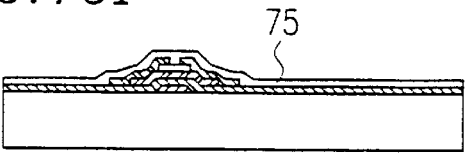
Figure 19E:
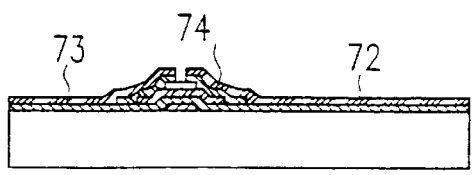

FIGS. 19D and 19E show the steps of producing the substrate of the reflection type LCD. As shown in FIGS. 19D and 19E, a metal film 71 is formed, and a pixel electrode 72, a source electrode 73, and a drain electrode 74 are formed of the metal film 71.

Figure 19G:
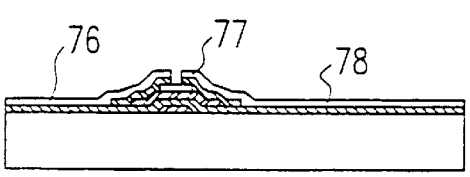

FIGS. 19F and 19G show the steps of producing the substrate of the transmission type LCD. As shown in FIGS. 19F and 19G, an ITO film 75 is formed, and a pixel electrode 78, a source electrode 76, and a drain electrode 77 are formed of the ITO film 75.

Accordingly, in the case where a source electrode and a drain electrode are formed of one metal film, or in the case where a source electrode and a drain electrode are formed of one ITO film, two or more kinds of photomasks which cannot be shared by the substrate of the reflection type LCD and the substrate of the transmission type LCD are required, and two kinds of film forming devices, two kinds of etching devices, etc. are also required.

As is apparent from the descriptions with reference to FIGS. 18A through 18J and 19A through 19G, when the substrate of the reflection type LCD and the substrate of the transmission type LCD are separately produced, mass-productivity will be decreased. However, when a metal film is used for the lower electrode as described above, an aperture ratio of a pixel portion in the substrate of the transmission type LCD is decreased. When transparent ITO is used for the lower electrode, electrolytic corrosion occurs between the lower electrode and the reflective electrode in the substrate of the reflection type LCD. Therefore, there was no choice but to separately produce the substrate of the reflection type electrode and the substrate of the transmission type LCD.

The present embodiment makes it possible for the substrate of the reflection type LCD and the substrate of the transmission type LCD to share the steps shown in FIGS. 18A through 18J and 19A through 19G, i.e., the steps immediately before forming the interlayer insulator on the substrate.

Figure 20A:
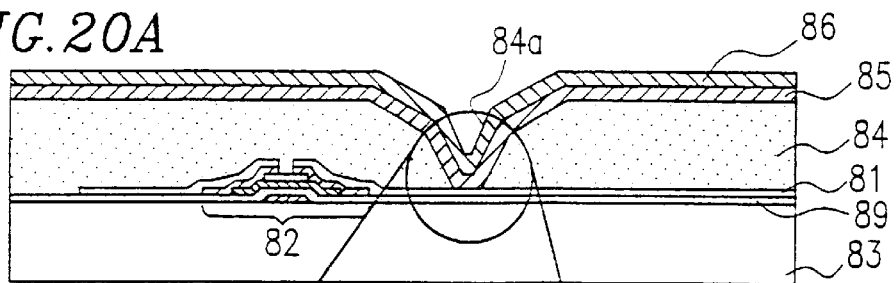
FIG. 20A shows a structure of a cross-section in the vicinity of a pixel electrode and a TFT of a substrate in Embodiment 5 according to the present invention, FIG. 20A' shows an enlarged contact hole portion.
Figure 20A:
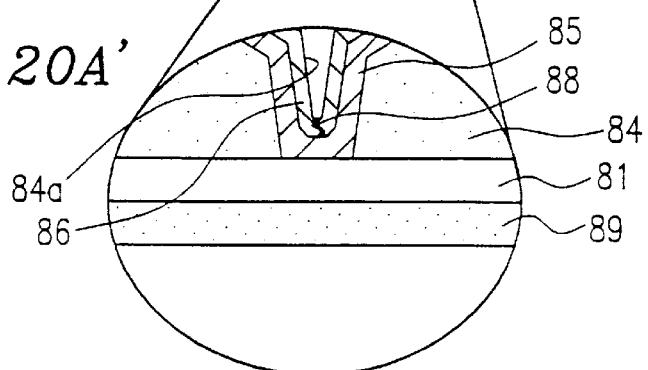
Figure 20B:
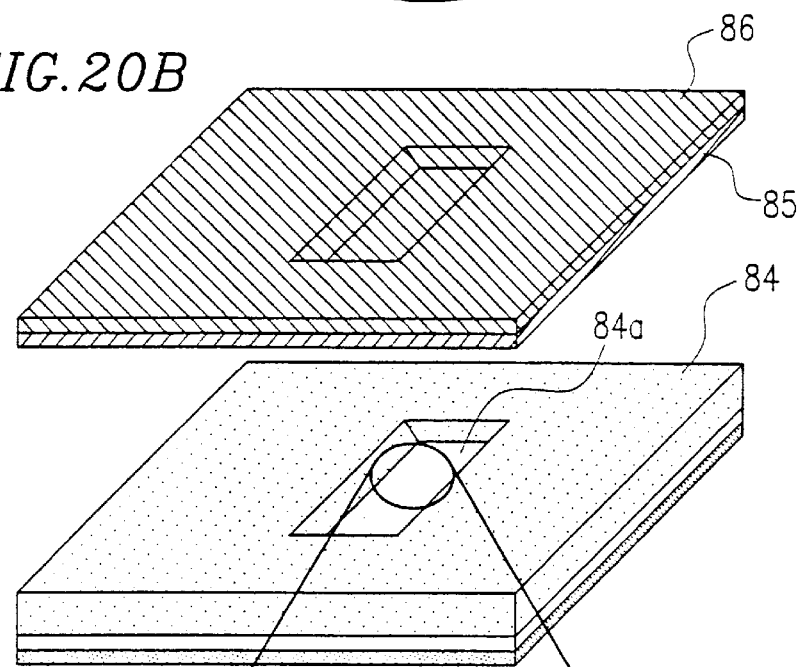
FIG. 20B is a perspective view showing a layered structure of an interlayer insulator and a reflective electrode, and FIG. 20B' shows an enlarged contact hole portion.
Figure 20B:
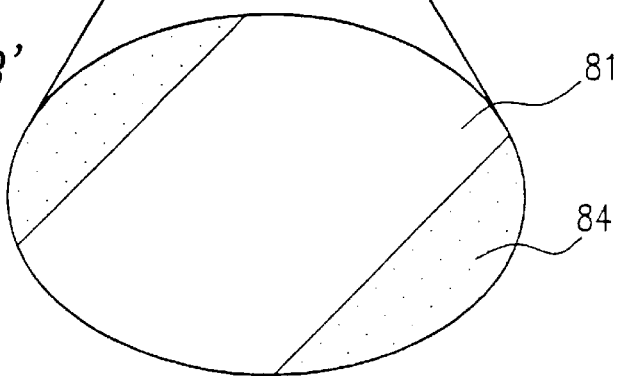

FIG. 20A shows a structure of a cross-section in the vicinity of a pixel electrode 81 and a TFT 82 in the substrate of the reflection type LCD in the present embodiment. An insulating film 89 is formed on a substrate 83, and the pixel electrode 81 made of ITO and the TFT 82 are formed thereon. Furthermore, as shown in FIG. 20B, an interlayer insulator 84, a protective metal film 85, and a reflective electrode 86 made of Al are successively formed, and the reflective electrode 86 and the protective metal film 85 are connected to the pixel electrode 81 through a contact hole 84a of the interlayer insulator 84.

In the substrate of the present embodiment with the above-mentioned structure, even when pinholes and cracks 88 are generated in the reflective electrode 86 in the contact hole 84a, and an electrolytic solution permeates into the pinholes and cracks 88, as shown in FIG. 20A', the protective metal film 85 blocks the permeation of the electrolytic solution. Therefore, a local battery structure is not formed between the reflective electrode 86 made of Al and the pixel electrode 81 made of ITO. Furthermore, electrolytic corrosion does not occur between the reflective electrode 86 and the pixel electrode 81. The pixel electrode 81 is not lost in the contact hole 84a. Furthermore, since the protective metal film 85 is made of metal, the connection between the reflective electrode 86 and the pixel electrode 81 is not damaged by the protective metal film 85.

The substrate of the present embodiment is intended for a reflection type LCD. However, the pixel electrode 81 made of ITO is used, so that the substrate of the present embodiment can also be adopted for a transmission type LCD without decreasing an aperture ratio in a pixel portion. In the case where the substrate of the present embodiment is adopted for a transmission type LCD, a transparent electrode of ITO (instead of the reflective electrode in the reflection type LCD) is connected to the pixel electrode 81 of ITO through the contact hole of the interlayer insulator.

Thus, the substrate of the present embodiment not only prevents electrolytic corrosion between the lower electrode and the reflective electrode in the substrate of the reflection type LCD, but also sufficiently improves an aperture ratio of a pixel portion in the substrate of the transmission type LCD. Furthermore, this enables the steps immediately before forming the interlayer insulator to be shared by the substrate of the reflection type LCD and the substrate of the transmission type LCD.

In the present embodiment, the source electrode and the drain electrode are formed of only one layer. However, these electrodes may have a two-layer structure of ITO and a metal film.

Figure 21:
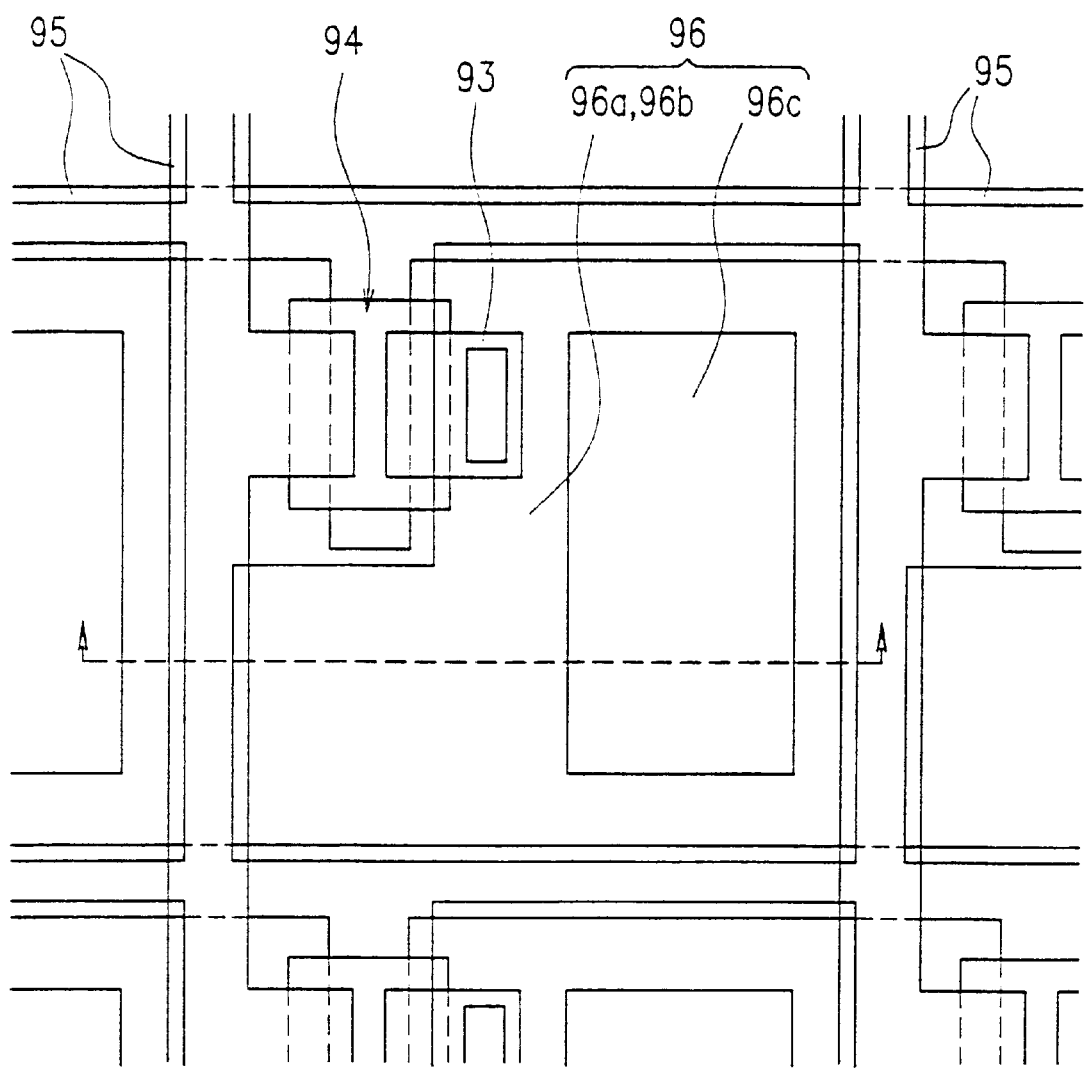
FIG. 21 is a plan view showing a transmission and reflection type LCD adopting the substrate structure shown in FIG. 20.
Figure 22:
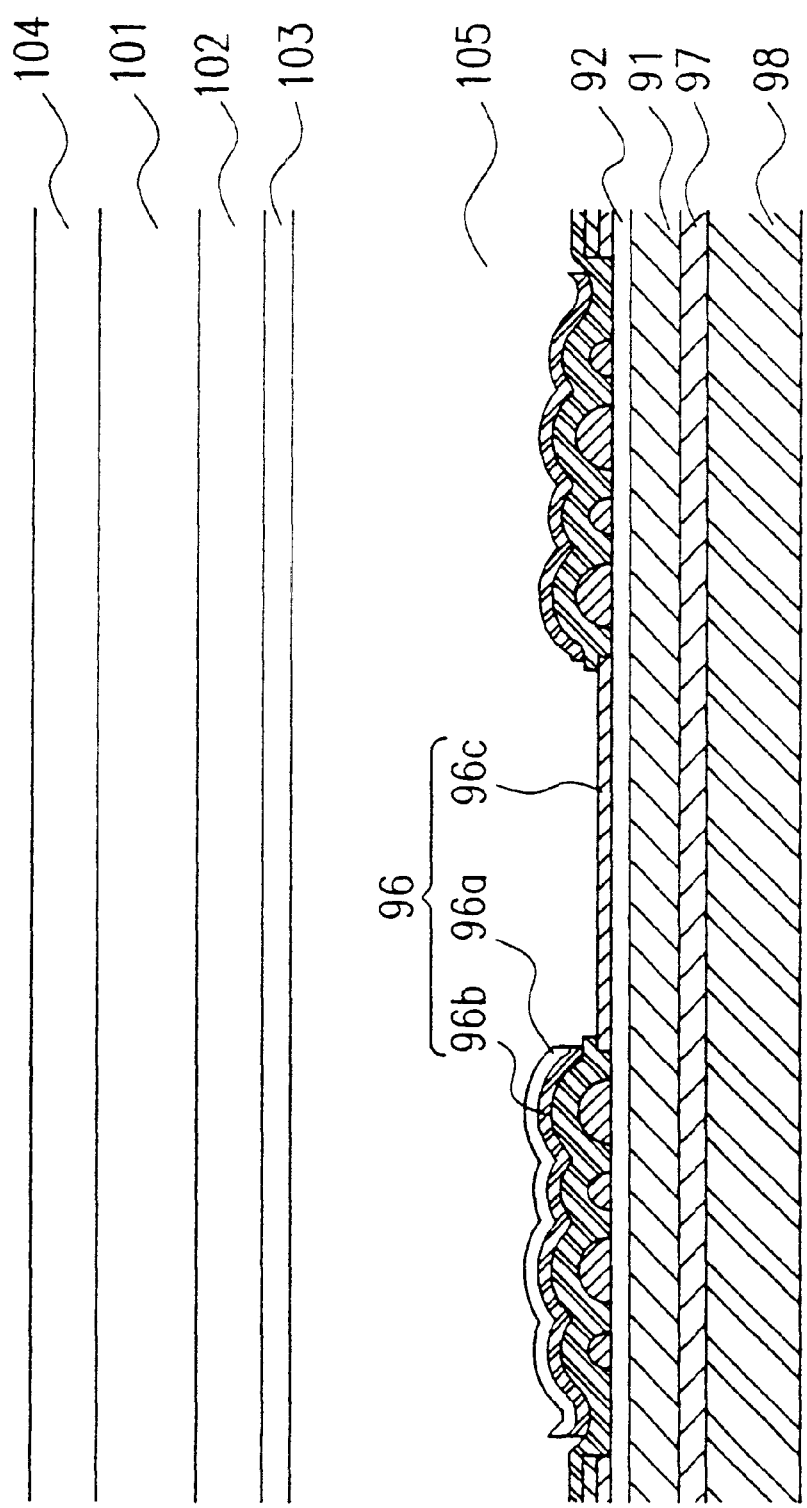
FIG. 22 is a cross-sectional view showing a transmission and reflection type LCD shown in FIG. 21.

FIG. 21 is a plan view showing a transmission and reflection type LCD adopting the substrate structure shown in FIGS. 20A through 20B', and FIG. 22 is a cross-sectional view showing the transmission and reflection type LCD adopting the substrate structure shown in FIGS. 20A through 20B'. In this transmission and reflection type LCD, an insulating film 92 is formed on a substrate 91, and a pixel electrode 93 made of ITO, a TFT 94, a signal line 95, an interlayer insulator (not shown), a display electrode 96, and the like are formed on the insulating film 92. The display electrode 96 includes a two-layered structure of a reflective electrode 96a of Al and a protective metal film 96b of Mo, and a transparent electrode 96c of ITO. The reflective electrode 96a is provided with unevenness, so that a metallic luster of the reflective electrode is decreased to obtain a more "white" state and even when light is incident at any angle, the intensity of light scattering in a direction vertical to a display screen is increased.

The reflective electrode 96a and the protective metal film 96b are connected to the pixel electrode 93 through a contact hole of the interlayer insulator. Due to the presence of the protective metal film 96b of Mo between the reflective electrode 96a of Al and the pixel electrode 93 of ITO, electrolytic corrosion between the reflective electrode 96a and the pixel electrode 93 can be prevented.

A polarizing/retardation plate 97 and a blacklight 98 are formed on an outside surface of the substrate 91. A color filter 102 and a counter electrode 103 of ITO are formed on an inner surface of a substrate 101, and a polarizing/retardation plate 104 is formed on an outer surface of the substrate 101. A liquid crystal layer 105 is interposed between the substrates 91 and 101.

According to the present invention, a resist film is not developed under the condition that the reflective electrode and the connecting electrode are in contact with each other. Thus, even in the case where the reflective electrode is made of Al and the connecting electrode is made of ITO, corrosion and dissolution caused by the generation of a local battery system do not occur, and production yield of a reflection type LCD which can be controlled by using a TFT array is enhanced.

Embodiment 6

Figure 29A:
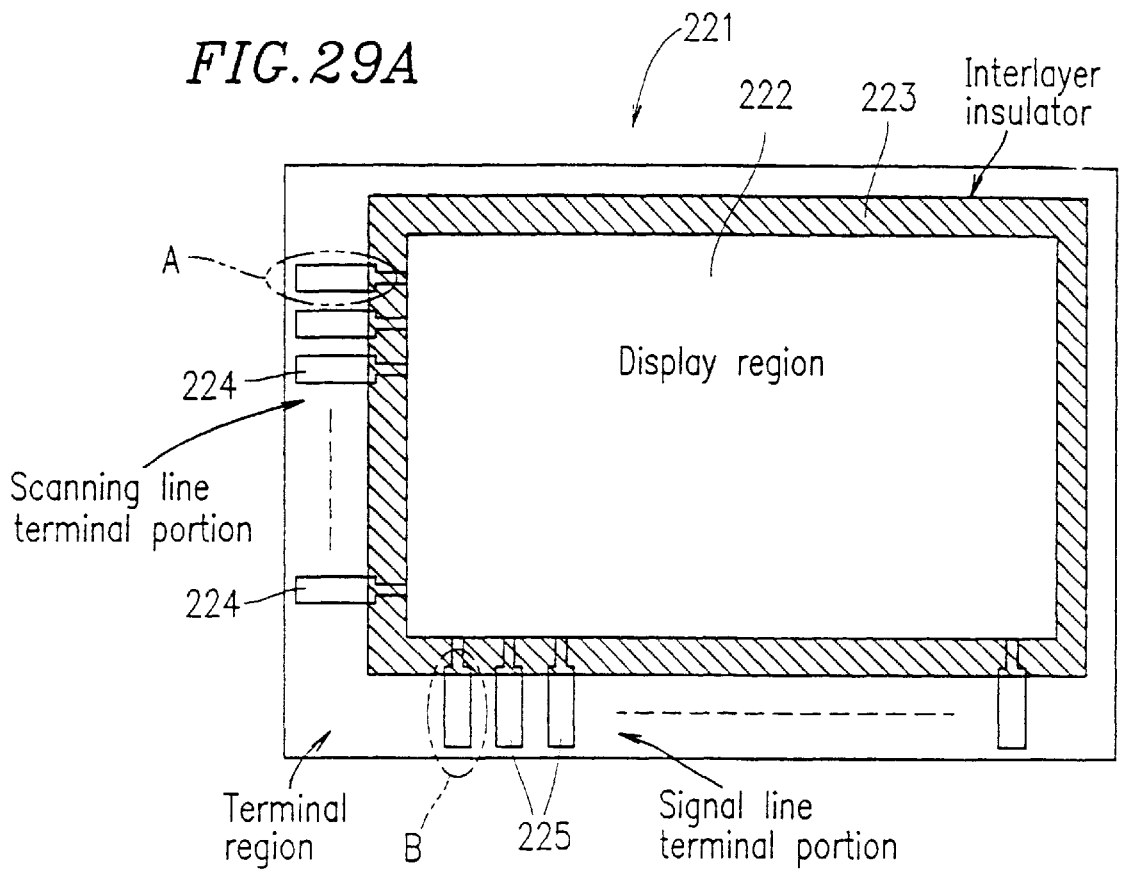
FIG. 29A is a plan view showing the entire liquid crystal display device according to the present invention.
Figure 29B:
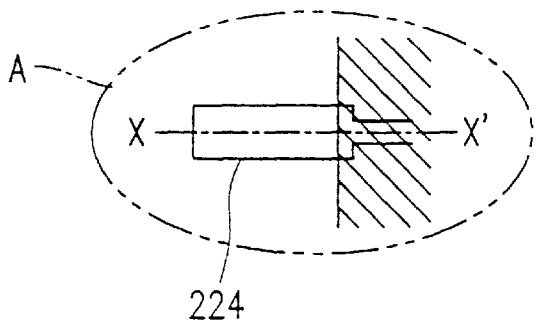
FIGS. 29B and 29C are plan views of an enlarged connecting electrode portion.
Figure 29C:
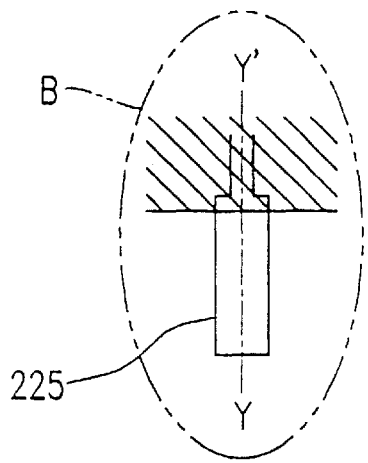
Figure 30A:
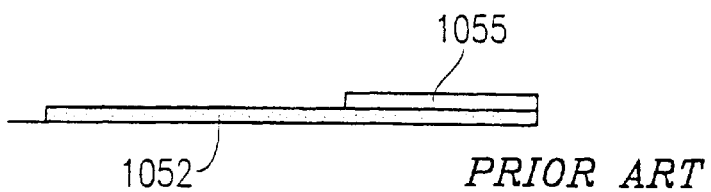
FIGS. 30A through 30F are cross-sectional views showing a process of forming a connecting electrode in a terminal portion of a scanning line in a conventional liquid crystal display device.
Figure 30B:
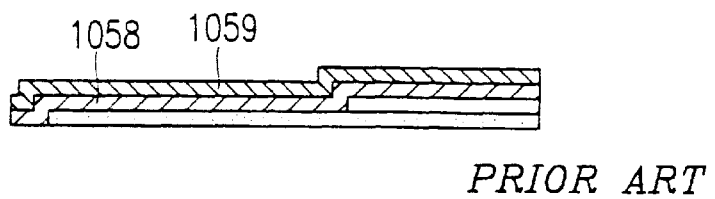
Figure 30C:
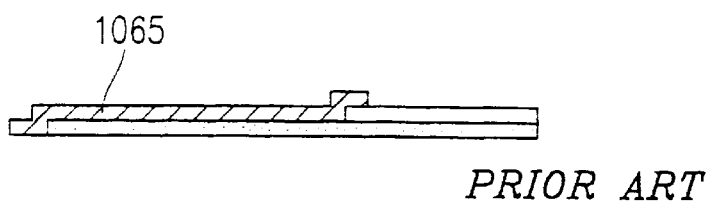
Figure 30D:
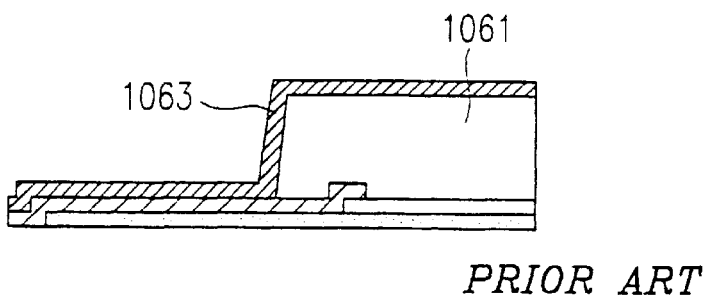
Figure 30E:
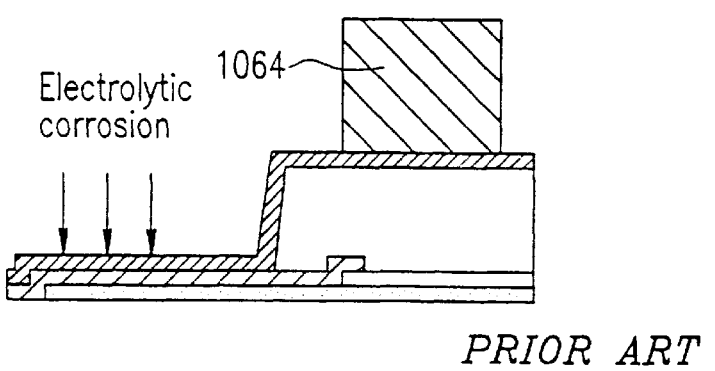
Figure 30F:
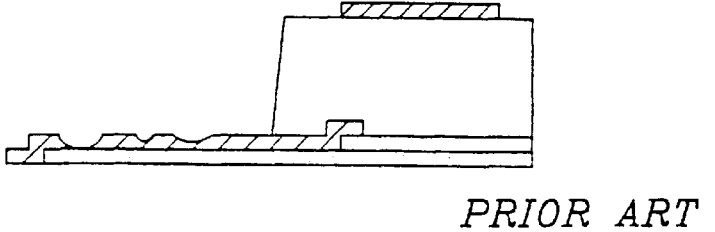
Figure 31A:
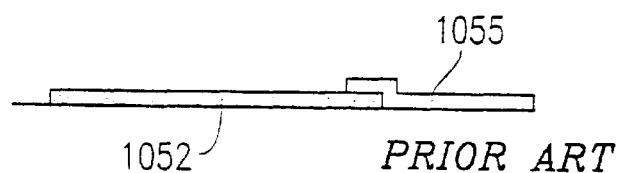
FIGS. 31A through 31F are cross-sectional views showing a process of forming a connecting electrode in a terminal portion of a signal line in a conventional liquid crystal display device.
Figure 31B:
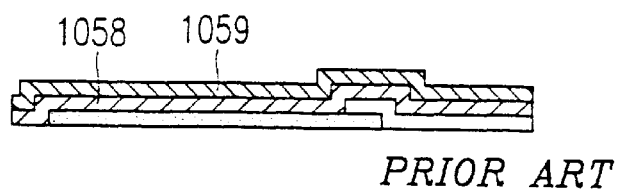
Figure 31C:
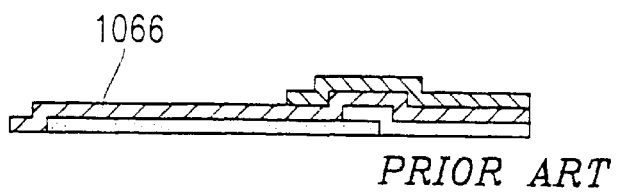
Figure 31D:
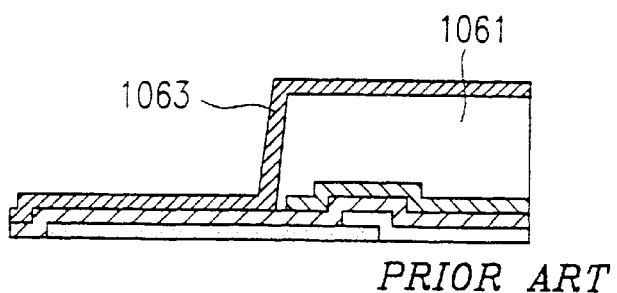
Figure 31E:
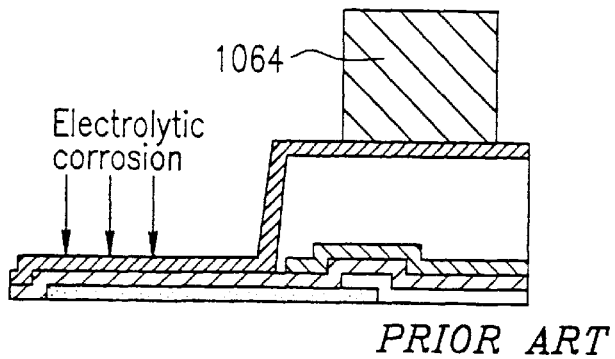
Figure 31F:
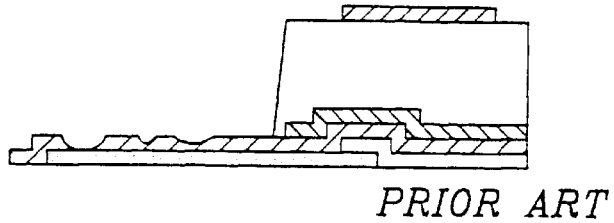

Referring to FIGS. 29A through 29C, a positional relationship between a display region and a connecting electrode region (terminal portion) in the present embodiment will be briefly described.

As shown in FIG. 29A, an LCD 221 in the present embodiment includes a display region 222 in which a liquid crystal layer is interposed between substrates, and an interlayer insulator 223 extends outside the display region. Furthermore, as shown in FIGS. 29B and 29C, scanning line terminal portions 224 for inputting a signal to a scanning line, and signal line terminal portions 225 for inputting a signal to a signal line are formed outside the interlayer insulator 223.

Hereinafter, the present embodiment of the present invention will be described with reference to FIGS. 23 through 25.

Figure 23:
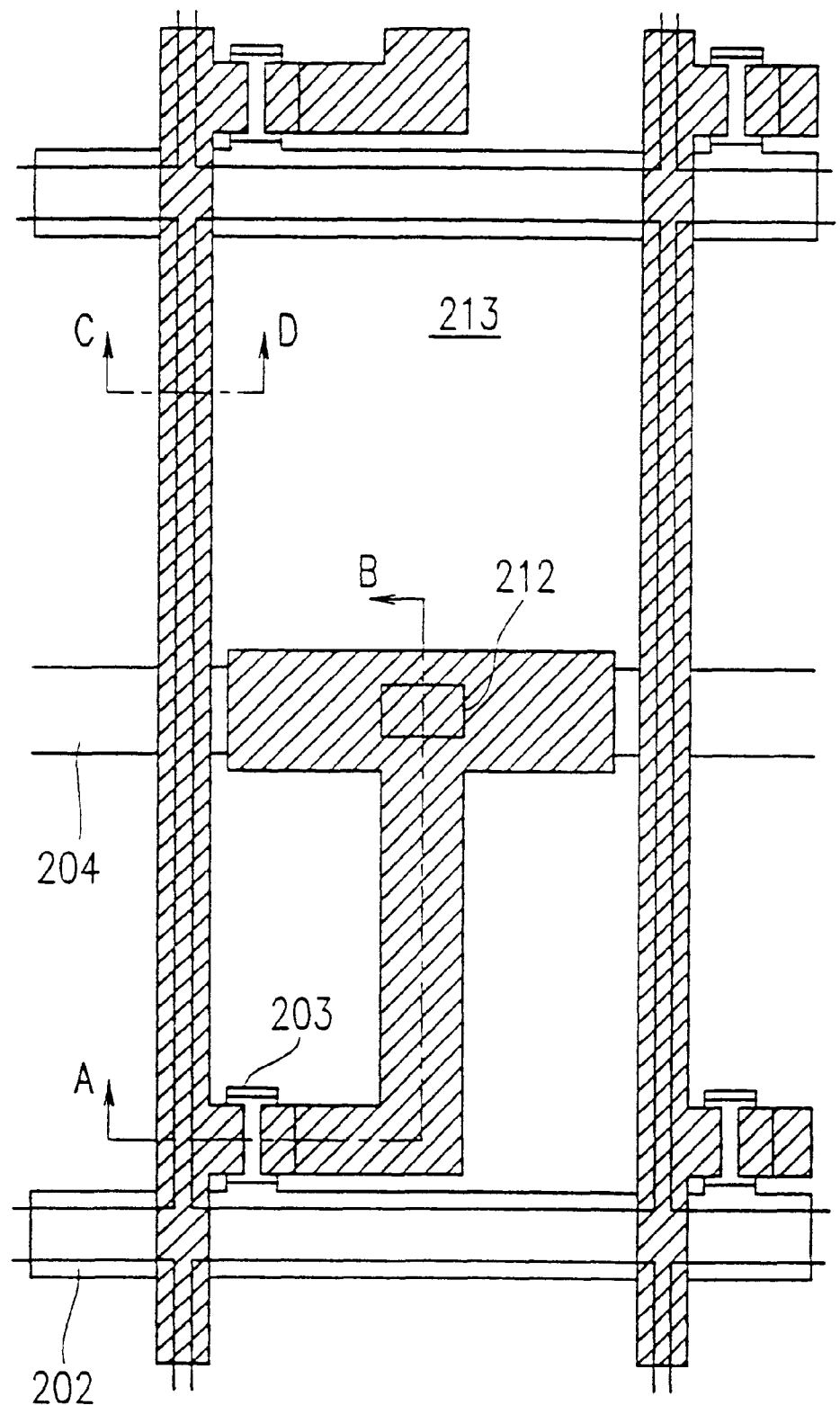
FIG. 23 is a plan view showing a pixel portion in a liquid crystal display device in Embodiment 6 of the present invention.

FIG. 23 is a plan view of a pixel portion of a LCD in the present embodiment. FIG. 24 is a cross-sectional view taken along a line A-B in FIG. 23. FIG. 25 is a cross-sectional view taken along a line C-D in FIG. 23.

Figure 24:
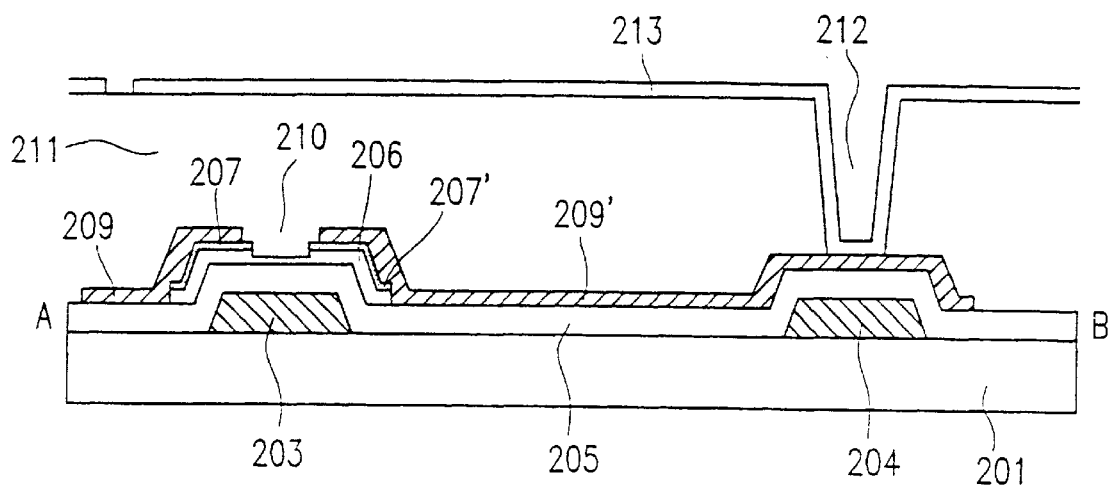
FIG. 24 is a cross-sectional view taken along a line A-B in FIG. 23.
Figure 25:
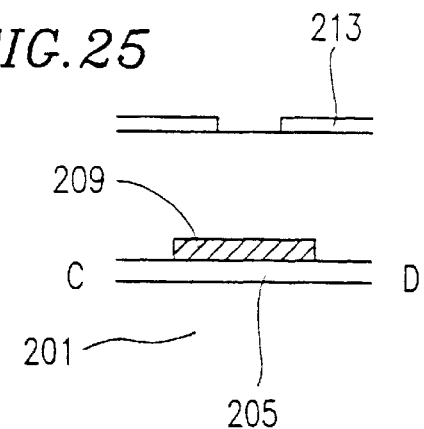
FIG. 25 is a cross-sectional view taken along a line C-D in FIG. 23.

As shown in FIGS. 23 and 24, a gate signal line 202 and a gate electrode 203 extending from the gate signal line 202 which are made of conductive thin films of Al, Mo, Ta, and the like, and a capacitance line 204 are formed on an insulating substrate 201. As the insulating substrate 201, glass or a glass substrate with an insulating film of $Ta_2O_5$ and $SiO_2$ formed as a base coat film thereon are used. The capacitance line 204 may also function as the gate signal line 202.

A gate insulating film 205 is formed on the gate go electrode 203. In the present embodiment, an $SiN_x$ film is formed by a P-CVD method to obtain the gate insulating film 205. In order to enhance insulation, the gate electrode 203 may be anodized to form a first insulating film, with the $SiN_x$ film being as a second insulating film. A semiconductor layer (amorphous Si) 206 is formed on the gate insulating film 205 by a P-CVD method.

Contact layers 207 and 207' made of amorphous Si or micro-crystal Si doped with $n^+$-type impurities are formed on the semiconductor layer 206 by a P-CVD method. The contact layers 207 and 207' and the semiconductor layer 206 are patterned into an island shape by dry etching using a mixed gas of HCl and $SF_6$. As an etching gas, a mixed gas of $CF_4$ and $O_2$, a $BCl_3$ gas, and the like may be used. Furthermore, wet etching using an Si etchant (HF and $HNO_3$, etc.) may be conducted for patterning.

An ITO film is formed on the contact layers 207 and 207' by a sputtering method, and a metal layer of Ta, Mo, and the like is formed thereon. The metal layer is patterned by photolithography, followed by etching. Then, the ITO film is also patterned by photolithography, and etched with an ITO etchant (HCl+$HNO_3$, HCl+$FeCl_3$, etc.), whereby a signal line 209 and a signal line 209' are formed. The ITO film can be patterned by etching, using the metal layer as a mask.

Then, the amorphous Si or micro-crystal Si film doped with $n^+$-type impurities on the semiconductor layer 206 are removed by etching, whereby the contact layers 207 and 207' for a source and a drain are formed to complete a TFT 210.

After the completion of the TFT 210, for example, a photosensitive acrylic organic resin film is coated to form a interlayer insulator 211, and a contact hole 212 is formed in the interlayer insulator 211. Finally, a reflective electrode 213 made of Al is formed by sputtering, and patterned to a predetermined shape, whereby a pixel portion of an LCD in the present embodiment is completed.

The reflective electrode 213 may be formed only in a portion of the pixel portion, and the remaining pixel portion may be adapted for transmitting light.

Furthermore, the interlayer insulator 211 may be provided with unevenness for forming a reflective electrode having a light dispersion property. Exemplary steps of forming unevenness (not shown in FIG. 24) will be briefly described with reference to FIGS. 26A through 26G.

Figure 26A:
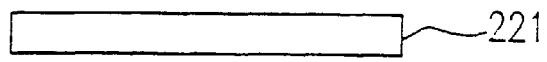
FIGS. 26A through 26G are cross-sectional views showing a process of forming unevenness for forming a reflective electrode providing an interlayer insulator with a light diffusion property in a liquid crystal display device in Embodiment 6 according to the present invention.
Figure 26B:
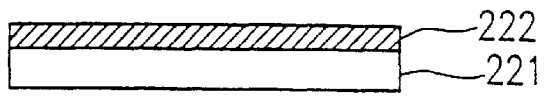
Figure 26C:
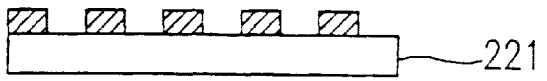
Figure 26D:
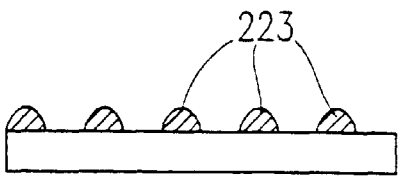
Figure 26E:
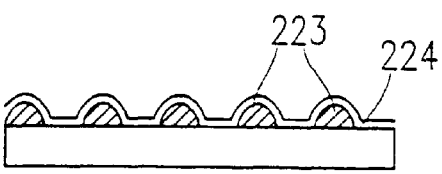
Figure 26F:
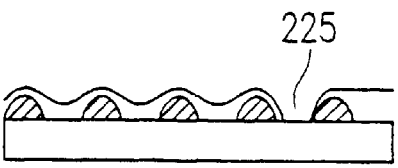
Figure 26G:
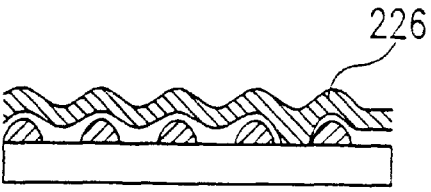

First, a photosensitive resin 222 is coated (FIG. 26B) onto a glass substrate 221 (FIG. 26A). The resultant substrate is exposed to light and developed (FIG. 26C), and baked to form chamfered convex portions 223 (FIG. 26D). A flattening film 224 is coated so as to cover the convex portions 223 (FIG. 26E). The resultant layered structure is exposed to light and developed to form a contact hole 225 (FIG. 26F), and a reflective electrode 226 is formed (FIG. 26G). Thus, the reflective electrode 226 with smooth unevenness can be obtained.

Embodiment 7

Hereinafter, Embodiment 7 will be described with reference to FIGS. 27A through 27F and FIGS. 28A through 28F.

FIGS. 27A through 27F are cross-sectional views showing a process for forming a connecting electrode in a terminal portion of a scanning line in an LCD in Embodiment 7. FIGS. 28A through 28F are cross-sectional views showing a process for forming a connecting electrode in a terminal portion of a signal line in an LCD in Embodiment 7. FIGS. 27A through 27F are cross-sectional views taken along a line X-X' in FIG. 29B, and FIGS. 28A through 28F are cross-sectional views taken along a line Y-Y' in FIG. 29C.

Figure 27A:
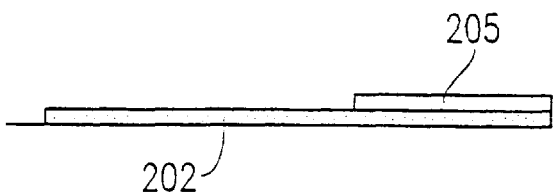
FIGS. 27A through 27F are cross-sectional views showing a processe of forming a connecting electrode in a terminal portion of a scanning line in a liquid crystal display device in Embodiment 7 according to the present invention.
Figure 28A:
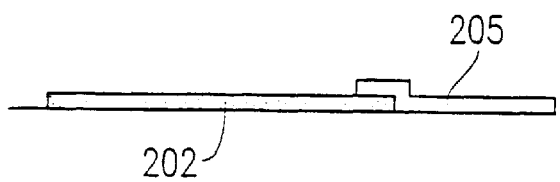
FIGS. 28A through 28F are cross-sectional views showing a process of forming a connecting electrode in a terminal portion of a signal line in a liquid crystal display device in Embodiment 8 according to the present invention.

In a terminal portion of a scanning line and a signal line in an LCD in Embodiment 7, a Ta line which is to be a scanning line 202 is formed on an insulating substrate, and a gate insulating film 205 is formed, as shown in FIGS. 27A and 28A.

Figure 27B:
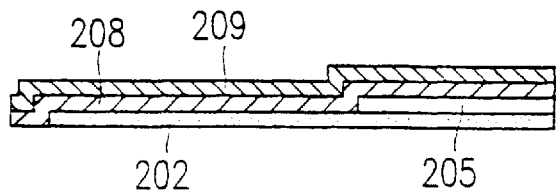
Figure 27C:
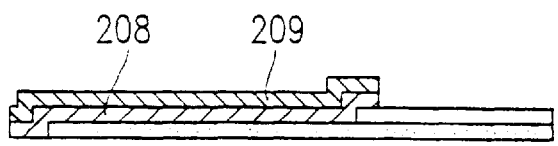
Figure 28B:
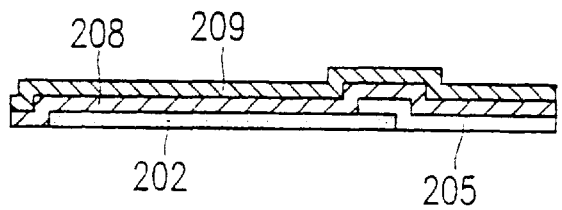
Figure 28C:
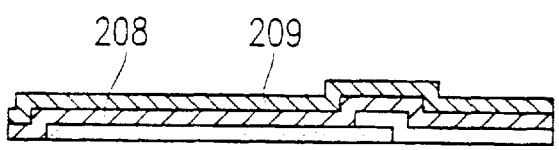

Next, as shown in FIGS. 27B and 28B, an ITO film 208 to be a signal line and a signal line film 209 are respectively formed. Thereafter, as shown in FIG. 27C and 28C, the ITO film 208 and the signal line film 209 formed during the previous step are patterned, and a connecting electrode portion is formed by leaving the ITO film 208 and the signal line film 209 in the line terminal portion. The signal line film 209 is composed of one of Ta, an alloy containing Ta as its main component and TaN or a layered film thereof.

Figure 27D:
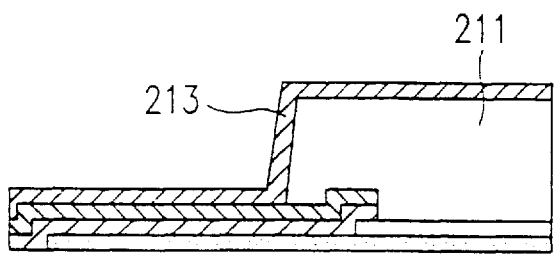
Figure 27E:
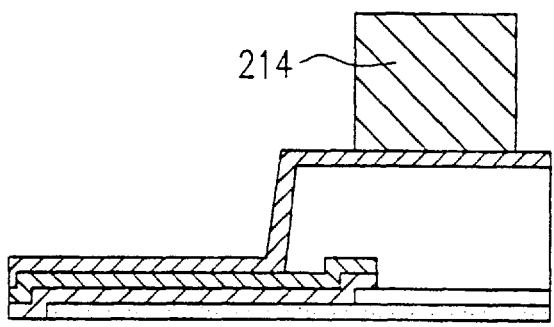
Figure 28D:
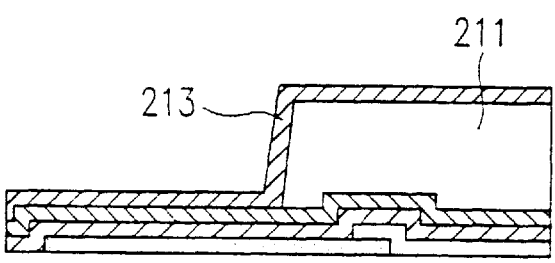
Figure 28E:
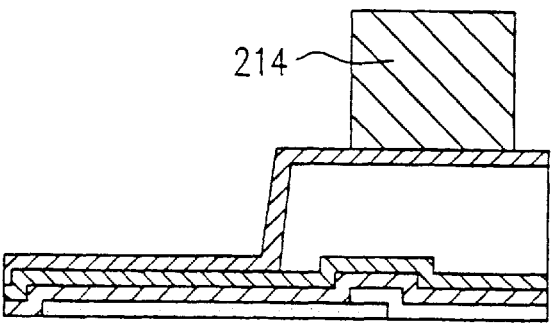

Next, as shown in FIGS. 27D and 28D, a photo-sensitive acrylic organic resin film is coated to form an interlayer insulator 211. Then, an Al film 213 which is to be a reflective electrode is formed. Sine it is impossible to partially form an Al film in a mass-production process, the Al film is formed over the entire surface of the substrate. As shown in FIG. 27E and 28E, the Al film 213 is formed even on the ITO film 208 and the signal line film 209 (connecting electrode portion), and a resist film 214 will be exposed to light and developed by photolithography under this condition.

However, unlike a connecting electrode portion in a terminal portion of a scanning line and a signal line in the conventional LCD, the signal line film 209 is formed on the ITO film 208 in Embodiment 7 of the present invention. Therefore, electrolytic corrosion does not occur between the Al film 213 and the ITO film 208 even when an alkaline developer is used, and hence, the Al film 213 will not be damaged.

After forming the resist film 214 by photolithography, the Al film 213 is etched. In Embodiment 7, the Al film 213 is etched by a dry etching method, using a BCl₃ gas and a Cl₂ gas. The etching selectivity of this etching method is as shown in Table 3.

TABLE 3

| | ITO | Ta | Interlayer insulator | Al |
|---|---|---|---|---|
| BCl₃ + Cl₂ | Not etched | Etched | Not etched | Etched |

Figure 27F:
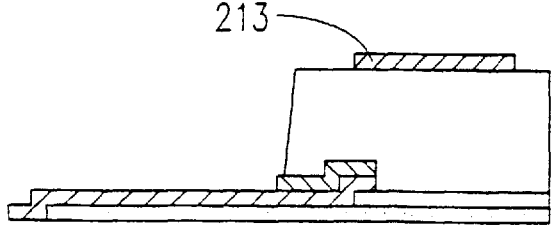
Figure 28F:
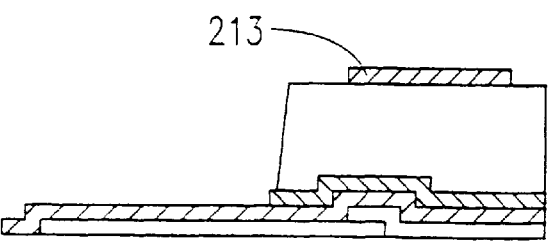

The etching method in Embodiment 7 is capable of removing the signal line film 209 composed of one of Ta, an alloy containing Ta as its main component and TaN or a layered film thereof remaining on the connecting electrode portion, as well as the Al film 213. In a final configuration, as shown in FIGS. 27F and 28F, the ITO film 208 remains on the surface of the scanning line 202. In this way, the connecting electrode in the terminal portion of the scanning line and the signal line in the LCD in Embodiment 7 is formed.

According to the structure of the connecting electrode in the present embodiment, electrolytic corrosion between the ITO film 208 and the Al film 213 can be prevented, without increasing the number of production steps compared with the conventional example, by conducting the above-mentioned dry etching for etching the Al film 213. Furthermore, an LCD can be produced with high yield at a low cost, in which a display is performed utilizing reflected light.

In Embodiment 4, it has been described that when the protective metal layer is formed even under the interlayer insulator, the interlayer insulator is floated due to overetching, etc. In the present embodiment, dry etching is adopted for etching the protective metal film and the reflective electrode. Unlike wet etching, according to dry etching, anisotropy is likely to be caused in an etching direction, and etching is likely to proceed in a vertical direction to the substrate. Therefore, the protective metal film disposed under the interlayer insulator is unlikely to be etched, and the interlayer insulator is unlikely to be floated.

Embodiment 8

In Embodiment 7, a method for producing a connecting electrode using a dry etching method for etching the Al film 213 has been described. In Embodiment 8, a method for producing a connecting electrode at a lower cost by using wet etching will be described.

The production steps in Embodiment 8 are the same as those in Embodiment 7, with the following exception.

In Embodiment 8, a Mo-type metal layer is used for forming the signal line film 209. After the resist film 214 is formed by photolithography, the Al film 213 is etched by a wet etching method using a solution containing phosphoric acid, nitric acid, acetic acid, and water. The etching selectivity of this etching method is as shown in Table 4.

TABLE 4

| | ITO | Mo | Interlayer insulator | Al |
|---|---|---|---|---|
| Phosphoric acid + nitric acid + acetic acid + water | Not etched | Etched | Not etched | Etched |

The etching method in Embodiment 8 is capable of removing the signal line film 209 made of Mo remaining on the connecting electrode portion, as well as the Al film 213. In a final configuration, as shown in FIG. ures 27F and 28F, the ITO film 208 remains on the surface of the connecting electrode in the line terminal portion. Thus, the connecting electrode in the terminal portion of the scanning line and the signal line in the LCD in Embodiment 8 is formed.

According to the structure of the connecting electrode in the present embodiment, electrolytic corrosion between the ITO film 208 (which is to be the connecting electrode) and the Al film 213 (which is to be the reflective electrode) can be prevented, without increasing the number of production steps compared with the conventional example, by conducting the above-mentioned wet etching for etching the Al film 213. Furthermore, an LCD can be produced with high yield and at a low cost compared with Embodiment 7, in which a display is performed utilizing reflected light.

In Embodiment 4, it has been described that when the protective metal layer is formed even under the interlayer insulator, the interlayer insulator is floated due to overetching, etc., and wet etching is adopted. As described in Embodiment 3, by forming the protective metal film of an alloy to adjust an etching grade, the above-mentioned problem can be solved, and the interlayer insulator is unlikely to be floated.

As described above, according to the method for producing an LCD of the present invention, a connecting electrode portion is composed of at least two kinds of metal layers, and a metal layer other than a metal layer to be a connecting electrode is removed after formation of a reflective electrode material. Thus, the metal layer to be the connecting electrode and the reflective electrode material do not come into contact with each other during the producing process of the LCD. Therefore, electrolytic corrosion does not occur between the connecting electrode and the reflective electrode material, which makes it possible to protect the connecting electrode from damage, and enhance production yield.

Furthermore, according to the method for producing an LCD of the present invention, the same etchant is used during the step of patterning the reflective electrode material and the step of leaving at least one metal layer of at least two metal layers included in the connecting electrode portion and removing the remaining metal layer. Thus, production yield can be enhanced easily without increasing the production steps, compared with a conventional method for producing an LCD.

Furthermore, according to the method for producing an LCD of the present invention, at least two different kinds of metal layers included in the signal line and the connecting electrode portion are formed of an ITO film, and one of Mo, an alloy containing Mo as its main component, Ta, an alloy containing Ta as its main component or a layered film thereof. The signal line can have a layered structure of ITO and a metal layer without increasing the production steps, so that a line resistance can be decreased. Furthermore, the connecting electrode can be formed of an ITO film, so that a high resistance due to the surface oxidation during the later step can be prevented.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a substrate of a reflection type liquid crystal display device including a transparent substrate, a substrate having a reflective metal film, a liquid crystal layer interposed between the substrates, a pixel electrode for driving the liquid crystal layer by applying a voltage to the liquid crystal layer, and a connecting electrode electrically connected to the pixel electrode through a bus line for inputting a signal from outside, the method comprising the steps of:

forming and patterning a conductive film for the connecting electrode on the substrate on which a reflective metal film is to be formed, forming and patterning the reflective metal film, and exposing an entire terminal portion of the conductive film for the connecting electrode, wherein the reflective metal film is superimposed on the conductive film for the connecting electrode via a protective metal film at least once between the step of forming the conductive film and the step of patterning the reflective metal film.

2. A method for producing a substrate of a reflection type liquid crystal display device according to claim 1, wherein the protective metal film and the reflective metal film are patterned simultaneously between the step of forming the conductive film and the step of patterning the reflective metal film and after the reflective metal film is superimposed on the conductive film for the connecting electrode via the protective metal film.

3. A method for producing a substrate of a reflection type liquid crystal display device according to claim 1, wherein the method further comprises the step of exposing the conductive film for the connecting electrode after the step of patterning the reflective metal film.

4. A method for producing a substrate of a reflection type liquid crystal display device according to claim 3, wherein the step of exposing the conductive film for the connecting electrode comprises the step of removing the reflective metal film and the protective metal film from the conductive film.

5. A method for producing a substrate of a reflection type liquid crystal display device according to claim 4, wherein the reflective metal film and the protective metal film are removed simultaneously on the conductive film.

6. A method for producing a substrate of a reflection type liquid crystal display device according to claim 1, wherein the reflective metal film forms a part or an entirety of the pixel electrode.

7. A method for producing a substrate of a reflection type liquid crystal display device according to claim 1 characterized in that the reflective metal film comprises Al or an Al alloy and the conductive film for the connecting electrode comprises ITO.

8. A method for producing a substrate of a reflection type liquid crystal display device including a transparent substrate, a substrate having a reflective metal film, a liquid crystal layer interposed between the substrates, a pixel electrode for driving the liquid crystal layer by applying a voltage to the liquid crystal layer, and a connecting electrode electrically connected to the pixel electrode through a bus line for inputting a signal from outside, the method comprising the steps of:

forming and patterning a conductive film for the connecting electrode on the substrate on which a reflective metal film is to formed, and forming and patterning the reflective metal film, wherein the reflective metal film is superimposed on the conductive film for the connecting electrode via a protective metal film at least once between the step of forming the conductive film and the step of patterning the reflective metal film, and wherein the protective metal film is patterned before the reflective metal film is superimposed on the conductive film for the connecting electrode via the protective metal film between the step of forming the conductive film for the connecting electrode and the step of patterning the reflective metal film.

9. A method for producing a substrate of a reflection type liquid crystal display device according to claim 8, wherein the conductive film for the connecting electrode and the protective metal film are patterned simultaneously.

10. A method for producing a substrate of a reflection type liquid crystal display device including a transparent substrate, a substrate having a reflective metal film, a liquid crystal layer interposed between the substrates, a pixel electrode for driving the liquid crystal layer by applying a voltage to the liquid crystal layer, and a connecting electrode electrically connected to the pixel electrode through a bus line for inputting a signal from outside, the method comprising the steps of:

forming and patterning a conductive film for the connecting electrode on the substrate on which a reflective metal film is to be formed;

forming and patterning the reflective metal film;

wherein the reflective metal film is superimposed on the conductive film for the connecting electrode via a protective metal film at least once between the step of forming the conductive film and the step of patterning the reflective metal film;

forming the protective metal film on the conductive film for the connecting electrode, between the step of forming the conductive film and the step of patterning the reflective metal film;

forming an interlayer insulator on which the reflective metal film is to be formed, under the condition that the protective metal film on the conductive film for the connecting electrode is exposed; and patterning the interlayer insulator, wherein after the step of patterning the reflective metal film, the method further comprises the step of removing the protective metal film so as to expose the conductive film for the connecting electrode.

11. A method for producing a substrate of a reflection type liquid crystal display device according to claim 10, wherein the reflective metal film forms part of an entirety of the pixel electrode.

12. A method for producing a substrate of a reflection type liquid crystal display device according to claim 10, wherein the reflective metal film comprises Al or an Al alloy and the conductive film for the connecting electrode comprises ITO.

13. A method for producing a substrate of a reflection type liquid crystal display device including a transparent substrate, a substrate having a reflective metal film, a liquid crystal layer interposed between the substrates, a pixel electrode for driving the liquid crystal layer by applying a voltage to the liquid crystal layer, and a connecting electrode electrically connected to the pixel electrode through a bus line for inputting a signal from outside, the method comprising the steps of:

forming and patterning a conductive film for the connecting electrode on the substrate on which a reflective metal film is to be formed;

forming and patterning the reflective metal film;

forming an interlayer insulator on which the reflective metal film is to be formed, under the condition that a protective metal film on the conductive film for the connecting electrode is exposed between the step of forming the conductive film and the step of patterning the reflective metal film;

patterning the interlayer insulator; and forming a protective metal film on the interlayer insulator, wherein the reflective metal film is superimposed on the conductive film for the connecting electrode via the protective metal film at least once between the step of forming the conductive film and the step of patterning the reflective metal film, and wherein after the step of patterning the reflective metal film, the method further comprises the step of removing the protective metal film so as to expose the conductive film for the connecting electrode.

14. A method for producing a substrate in a reflection type liquid crystal display device, according to claim 13, wherein the reflective metal film, the protective metal film, and a conductive film produced during a previous step are made of a material having etching selectivity.

15. A method for producing a substrate in a reflection type liquid crystal display device according to claim 13, wherein a switching element is provided between the reflective metal film and the bus line.

16. A method for producing a substrate in a reflection type liquid crystal display device according to claim 15, wherein a thin film transistor is formed as the switching element.

17. A method for producing a substrate in a reflection type liquid crystal display device according to claim 13, wherein the interlayer insulator is formed so as to be also present in a region outside a pixel in a display area.

18. A method for producing a substrate in a reflection type liquid crystal display device according to claim 13, wherein a photosensative resin film is used as the interlayer insulator.

19. A method for producing a substrate in a reflection type liquid crystal display device according to claim 18, wherein a plurality of uneven shapes are formed by patterning in a portion of the photosensative resin film under the reflective metal film.

20. A method for producing a substrate in a reflection type liquid crystal display device according to claim 19, wherein a material for the connecting electrode is ITO, and a material for the reflective metal film is Al.

21. A method for producing a substrate in a reflection type liquid crystal display device according to claim 20, wherein the protective metal film formed on the connecting electrode is made of Mo or an alloy containing Mo as its main component.

22. A method for producing a substrate in a reflection type liquid crystal display device according to claim 20, wherein the protective metal film formed on the connecting electrode is made of Ti or an alloy containing Ti as its main component.

23. A method for producing a substrate in a reflection type liquid crystal display device according to claim 13, wherein a material for the connecting electrode is ITO.

24. A method for producing a substrate in a reflection type liquid crystal display device according to claim 13, wherein a material for the reflective metal film and metal for forming the protective metal film are prescribed so as to be etched with an identical etchant.

25. A method for producing a substrate of a reflection type liquid crystal display device according to claim 13, wherein the reflective metal film forms part or an entirety of the pixel electrode.

26. A method for producing a substrate of a reflection type liquid crystal display device according to claim 13, wherein the reflective metal film comprises Al or an Al alloy and the conductive film for the connecting electrode comprises ITO.

* * * * *